(12) United States Patent
Kraver et al.

(10) Patent No.: US 9,983,032 B1
(45) Date of Patent: May 29, 2018

(54) SENSOR DEVICE AND METHOD FOR CONTINUOUS FAULT MONITORING OF SENSOR DEVICE

(71) Applicant: NXP USA, INC., Austin, TX (US)

(72) Inventors: Keith L. Kraver, Gilbert, AZ (US);
Chad Dawson, Queen Creek, AZ (US);
Shiraz Jiju Contractor, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days. days.

(21) Appl. No.: 15/611,100

(22) Filed: Jun. 1, 2017

(51) Int. Cl.
*G01D 18/00* (2006.01)
*G01D 5/24* (2006.01)

(52) U.S. Cl.
CPC ............... *G01D 18/00* (2013.01); *G01D 5/24* (2013.01)

(58) Field of Classification Search
CPC ...... G01R 33/12; G05D 1/0274; H01H 83/20; G01D 5/24
See application file for complete search history.

(56) References Cited

U.S. PATENT DOCUMENTS

| | | | |
|---|---|---|---|
| 7,855,562 B2 | 12/2010 | Chiaburu et al. | |
| 9,238,580 B2 | 1/2016 | Alagarsamy et al. | |
| 2009/0277244 A1* | 11/2009 | Doll | B60T 8/885 |
| | | | 73/1.37 |
| 2011/0100126 A1* | 5/2011 | Jeong | G01C 19/5719 |
| | | | 73/514.32 |
| 2013/0269412 A1* | 10/2013 | Walter | G01L 9/003 |
| | | | 73/1.15 |
| 2016/0202286 A1 | 7/2016 | Aaltonen et al. | |

OTHER PUBLICATIONS

U.S. Appl. No. 15/144,985; Pressure Sensor Device and Method for Testing the Pressure Sensor Device; dated May 2, 2016.

\* cited by examiner

*Primary Examiner* — Jermele M Hollington
*Assistant Examiner* — Alvaro Fortich
(74) *Attorney, Agent, or Firm* — Charlene R. Jacobsen

(57) ABSTRACT

A sensor system includes first and second capacitive sensors. An excitation circuit, coupled with the sensors, applies an excitation voltage to each of the sensors. The excitation voltage is characterized by a first, second, and third excitation voltage components, wherein the second and third excitation voltage components have opposite polarities. A capacitance-to-voltage (C/V) converter, electrically coupled with the sensors, generates a differential-mode output signal in response to the first excitation voltage component applied to the sensors, and the C/V converter generates a common-mode output signal in response to the second and third excitation voltage components applied to the sensors. A signal processing unit, coupled with the C/V converter, extracts a sense signal from the differential-mode output signal, extracts a diagnostic signal from said common-mode out signal, and detects a fault condition in the sensor system when a difference between the sense and diagnostic signals is outside a preset limit.

20 Claims, 17 Drawing Sheets

SENSOR DEVICE AND METHOD FOR CONTINUOUS FAULT MONITORING OF SENSOR DEVICE

TECHNICAL FIELD OF THE INVENTION

The present invention relates generally to sensors. More specifically, the present invention relates to a sensor device and a method for continuous fault monitoring of the sensor device.

BACKGROUND OF THE INVENTION

Microelectromechanical systems (MEMS) technology has achieved wide popularity in recent years, as it provides a way to make very small mechanical structures and integrate these structures with electrical devices on a single substrate using conventional batch semiconductor processing techniques. One common application of MEMS is the design and manufacture of sensor devices. MEMS sensors, such as capacitive sensor devices, are widely used in applications such as automotive, inertial guidance systems, household appliances, game devices, protection systems for a variety of devices, and many other industrial, scientific, and engineering systems.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns a sensor system and methodology for continuous fault monitoring of the sensor system. More particularly, the sensor system and methodology enable generation of a desired sense signal and a diagnostic signal for fault monitoring by a time-multiplexed application of differential-mode and common-mode excitation voltage waveforms to the sensor device. Accordingly, the same measuring circuitry may be utilized to process the sense signal and the diagnostic signal without interruption of the measurement of the sense signal or a lapse in fault monitoring. Further, the configuration entails demodulation and filtering of a common output data stream to separate the diagnostic signal from the sense signal. Thus, the architecture may be implemented in a number of safety applications that require low-cost, continuous fault monitoring of MEMS sensors in which fault monitoring does not impact measurement of the desired signal.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
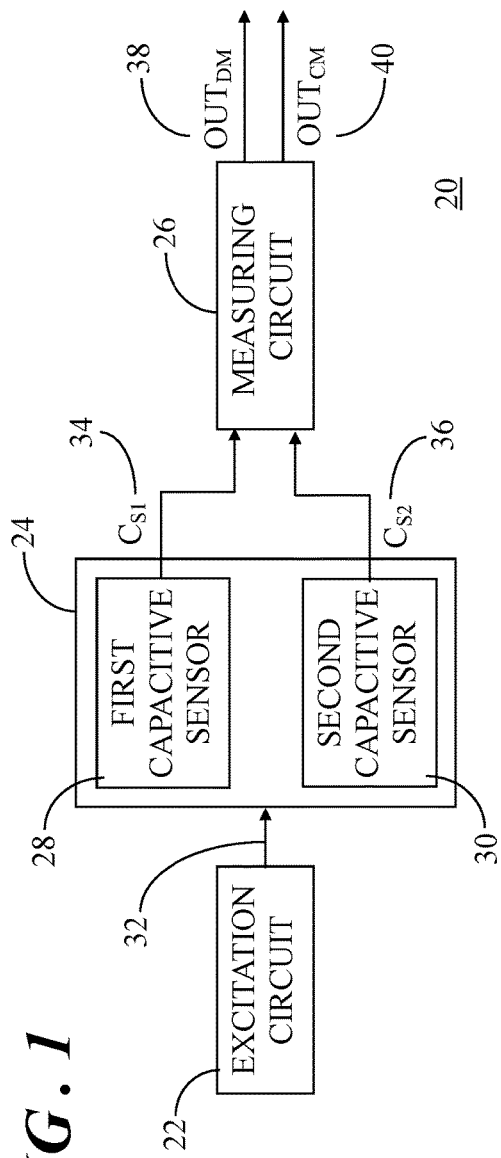
FIG. 1 shows in a simplified and representative form a block diagram of a microelectromechanical systems (MEMS) sensor system.

Referring to FIG. 1, FIG. 1 shows in a simplified and representative form a block diagram of a microelectromechanical systems (MEMS) sensor system 20. In this example, system 20 includes an excitation circuit 22 electrically coupled to a sensor device 24, and a measuring circuit 26 electrically coupled to sensor device 24. Sensor device 24 includes a first capacitive sensor 28 and a second capacitive sensor 30. Excitation circuit 22 is configured to excite first and second capacitive sensors 28, 30 of sensor device 24 by applying an excitation waveform 32 to first and second capacitive sensors 28, 30. In response to excitation waveform 32, measuring circuit 26 is configured to measure results from the excitation. That is, excitation results in the form of a first capacitance 34, labeled $C_{S1}$, is conveyed to measuring circuit 26 from first capacitive sensor 28 and a second capacitance 36, labeled $C_{S2}$, is conveyed to measuring circuit 26 from second capacitive sensor 30.

In an embodiment, excitation circuit 22 and measuring circuit 26 may be implemented on one or more application specific integrated circuits (ASIC) separate from sensor device 24. In another embodiment, excitation circuit 22, sensor device 24, and measuring circuit 26 may all be integrated in the same circuit, die, or package. Further, at least some of the elements and functions of excitation circuit 22 and measuring circuit 26 may be combined.

Measuring circuit 26 generally includes a signal chain (discussed below) that is used to process first and second capacitances 34, 36 from sensor device 24. In an embodiment, measuring circuit 26 may therefore output a desired differential-mode sense signal 38, labeled $OUT_{DM}$, and a common-mode diagnostic signal 40, labeled $OUT_{CM}$. Sense signal 38 is indicative of the stimulus being sensed. Whereas, diagnostic signal 40 may be indicative of a fault condition of system 20. As will be discussed in significantly greater detail below, the architecture of system 20 provides continuous fault monitoring without duplicating circuitry by time-multiplexing differential-mode and common-mode excitation voltage waveforms to yield excitation signal 32 at a specified duty cycle favoring the differential-mode excitation. The differential-mode excitation voltage is applied to first and second capacitive sensors 28, 30 to produce sense signal 38 in response to an external stimulus and the common-mode excitation voltage is applied to first and second capacitive sensors 28, 30 to produce diagnostic signal 40.

Figure 2:
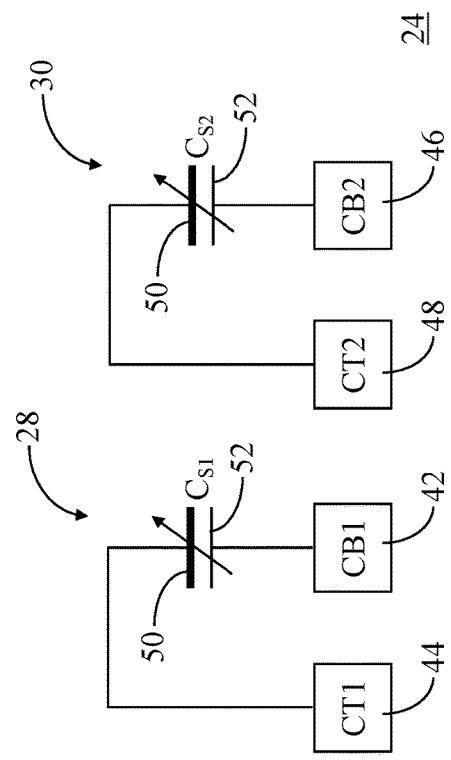
FIG. 2 shows in a simplified and representative form a schematic of capacitive sensors of the system of FIG. 1.

FIG. 2 shows in a simplified and representative form a schematic of sensor device 24 of system 20 (FIG. 1) including first and second capacitive sensors 28, 30. First capacitive sensor 28 has a first electrode connected to a pad 42, labeled CB1, and a second electrode connected to a pad 44, labeled CT1. Second capacitive sensor 30 has a first electrode connected to a pad 46, labeled CB2, and a second electrode connected to a pad 48, labeled CT2. Pads 42, 44, 46, 48 are used to make electrical connections between sensors 28, 30 and other circuits using, for example, wire bonds, solder balls, conductive vias, and the like.

In this example, the electrodes of first and second capacitive sensors 28, 30 are plate electrodes. As such the "T" in "CT1" and "CT2" refers to a top plate electrode and is illustrated throughout this disclosure with a heavy line 50. Conversely, the "B" in "CB1" and "CB2" refers to a bottom plate electrode and is illustrated throughout this disclosure with a light line 52. For consistency throughout, the top plate electrodes (e.g., CT1 and CT2) may be movable relative to the bottom plate electrodes (e.g., CB1 and CB2), with variable gaps being formed between the top and bottom plate electrodes. Excitation waveform 32 applied to first and second capacitive sensors 28, 30 charges first and second capacitive sensors 28, 30. When the movable top plate electrodes move in response to a particular external stimulus, the width of the gaps between the top and bottom electrodes change which in turn causes first and second capacitances 34, 36 to change. This change in capacitance can be collected as charge in measuring circuit 26 for further processing.

In some embodiments, first and second capacitive sensors 28, 30 may be pressure sensors configured to sense a pressure stimulus and provide first and second capacitances 34, 36 indicative of the pressure stimulus. However, it should be understood that first and second capacitive sensors 28, 30 may be any of a variety of capacitive transducers which may be independently configured to sense the desired stimulus (e.g., pressure, acceleration, angular velocity, and so forth).

Figure 3:
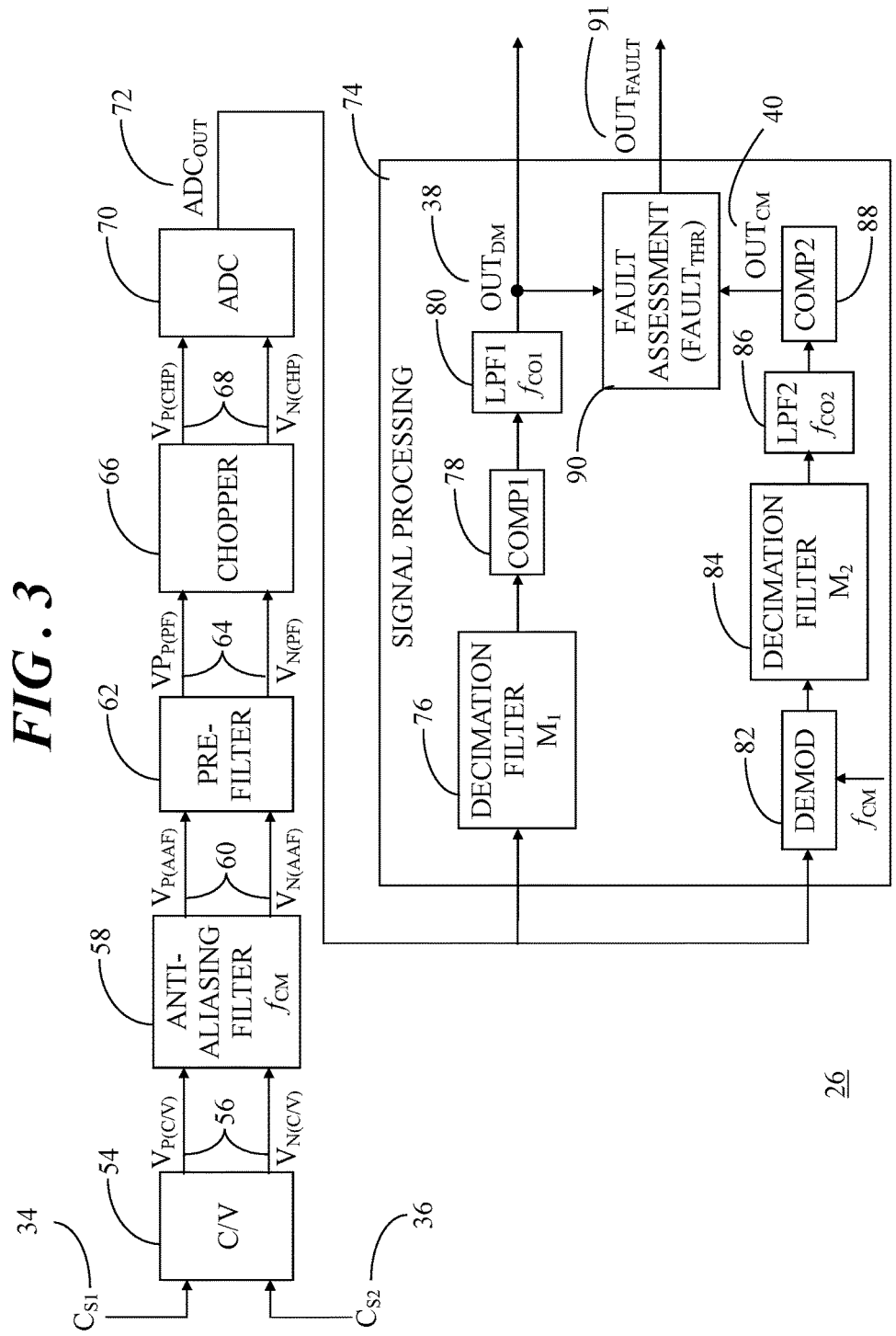
FIG. 3 shows a block diagram of a measuring circuit of the sensor system of FIG. 1 in accordance with an embodiment.

FIG. 3 shows a block diagram of measuring circuit 26 of system 20 (FIG. 1) in accordance with an embodiment. Measuring circuit 26 generally includes a signal chain used to process first and second capacitances 34, 36. A first stage of the signal chain includes a capacitance-to-voltage (C/V) converter 54 having an input connected to sensor device 24 (FIG. 1) for receiving first and second capacitances 34, 36 from sensor device 24 and converting them to a C/V output signal 56 (e.g., the difference between $V_{P(C/V)}$ and $V_{N(C/V)}$). The next stage of the signal chain may be an anti-aliasing filter 58 having an input connected to an output of C/V converter 54 for receiving C/V output signal 56 and producing a bandwidth restricted output signal 60 (e.g., the difference between $V_{P(AAF)}$ and $V_{N(AAF)}$). The next stage of the signal chain may be a pre-filter 62 having an input connected to an output of anti-aliasing filter 58 for receiving output signal 60 and producing a pre-filtered output signal 64 (e.g., the difference between $V_{P(PF)}$ and $V_{N(PF)}$). Pre-filter 62 may be followed by a chopper circuit 66 having an input connected to an output of pre-filter 62 for receiving pre-filtered output signal 64 and producing a data stream referred to herein as a chopper output signal 68 (e.g., the difference between $V_{P(CHP)}$ and $V_{N(CHP)}$). An analog-to-digital converter (ADC) 70 has an input connected to an output of chopper circuit 66 for receiving analog output signal 68 and converting chopper output signal 68 into a digital data stream 72 ($ADC_{OUT}$) indicative of the stimulus sensed by first and second capacitive sensors 28, 30 (FIG. 1) of sensor device 24 (FIG. 1). Thus, ADC 70 is electrically coupled to C/V converter 54 via the above-described signal chain.

Measuring circuit 26 further includes a signal processing unit 74 also coupled with C/V converter 54 via the above-described signal chain. Signal processing unit 74 generally includes a first decimation filter 76, a first compensation circuit (COMP1) 78, and a first low pass filter (LPF1) 80. Signal processing unit 74 further includes a demodulator (DEMOD) 82, a second decimation filter 84, a second low pass filter (LPF2) 86, and a second compensation circuit (COMP2) 88. ADC 70 has an output electrically coupled to an input of first decimation filter 76 and to an input of demodulator 82 so that both of first decimation filter and demodulator 82 receive digital data stream 72 for processing.

Excitation circuit 22 (FIG. 1) is configured to switch between a differential-mode and a common-mode of operation at a programmable duty cycle to produce a time-multiplexed differential-mode excitation voltage component and a common-mode excitation voltage component thus yielding excitation waveform 32. In an embodiment, first and second capacitances 34, 36 generated in response to an external stimulus are processed through the same C/V converter 54, anti-aliasing filter 58, pre-filter 62, chopper circuit 66, and ADC 70 to yield digital data stream 72. Accordingly, differential-mode output signals (corresponding to sense signal 38) and common-mode output signals (corresponding to diagnostic signal 40) can be processed by measuring circuit 26 with the same analog front end (i.e., C/V converter 54, anti-aliasing filter 58, pre-filter 62, and chopper circuit 66).

Following processing via the same analog front end, digital data stream 72 is thereafter processed at signal processing unit 74 (FIG. 3) to extract sense signals 38 and diagnostic signals 40. At signal processing unit 74, first decimation filter 76, first compensation circuit 78, and first low pass filter 80 suitably process the received digital data stream 72 to extract the differential-mode sense signal 38 from digital data stream 72. Conversely, demodulator 82, second decimation filter 84, second low pass filter 86, and second compensation unit 88 suitably process the received digital data stream 72 to extract the common-mode diagnostic signal 40. Signal processing unit 74 may further include a fault assessment circuit 90 having inputs for receiving sense signal 38 and diagnostic signal 40. Sense signal 38 and diagnostic signal 40 can be compared against one another by fault assessment circuit 90 another to determine whether a fault has occurred. For example, the difference between sense signal 38 and diagnostic signal 40 may be compared against a fault threshold value ($FAULT_{THR}$). Should the difference between sense signal 38 and diagnostic signal 40 be outside of a preset limit, e.g., fault threshold value, a determination can be made that a fault condition exists, and a flag 91, labeled $OUT_{FAULT}$, may be output from signal processing unit 74 indicating that sensor system 20 has failed.

Figure 4:
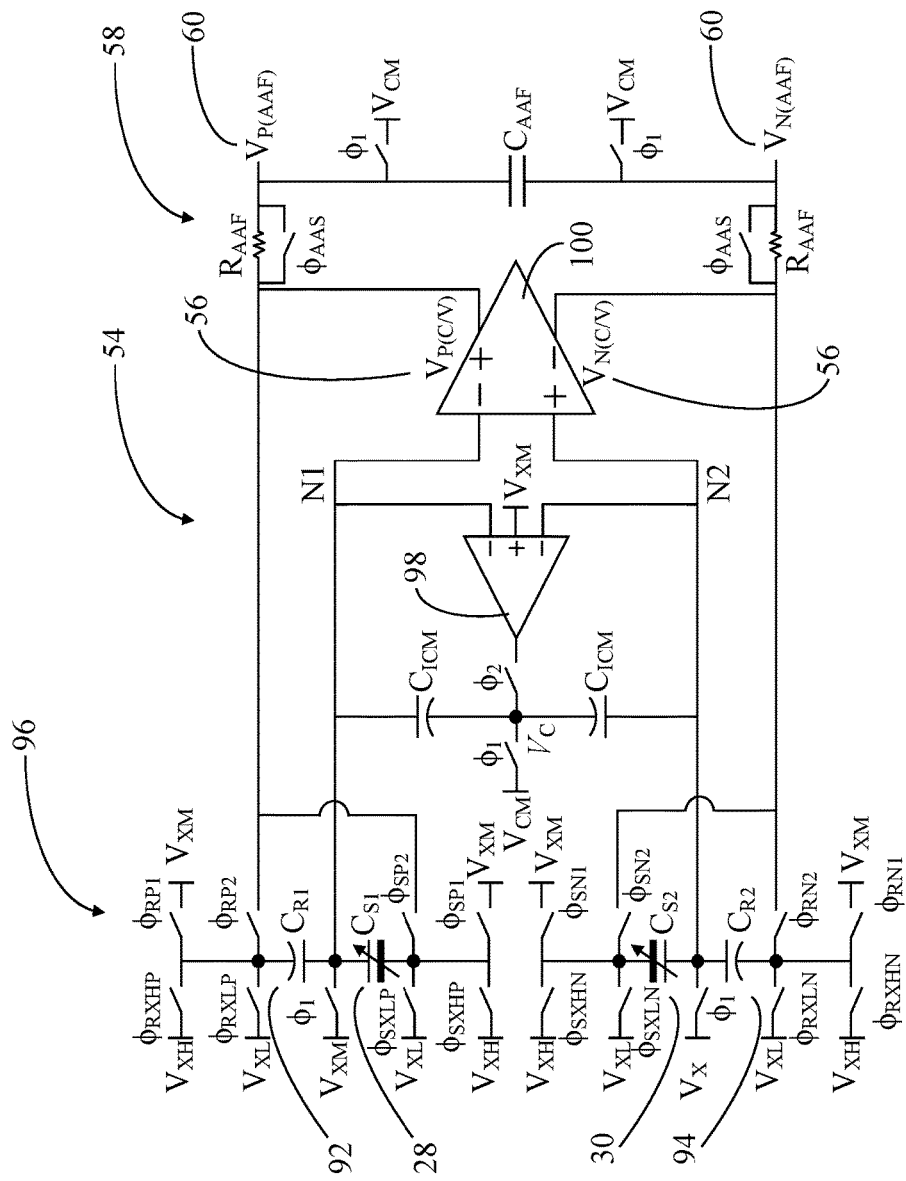
FIG. 4 shows a schematic diagram of a capacitive-to-voltage (C/V) converter and anti-aliasing filter of the measuring circuit.

FIG. 4 shows a schematic diagram of C/V converter 54 and anti-aliasing filter 58 of measuring circuit 26 (FIG. 3). Shown in FIG. 4 are first and second capacitive sensors 28, 30, reference capacitors 92, 94, a plurality of switches 96, and amplifiers 98, 100. First and second capacitive sensors 28, 30 may be mismatched or matched with respect to one another. Likewise, reference capacitors 92, 94 may be mismatched or matched with respect to one another. With regard to the variable first and second capacitive sensors 28, 30, the term "matched" refers to first and second capacitive sensors 28, 30 having the same response (capacitance value) in response to an external stimulus and the term "mismatched" refers to refers to first and second capacitive sensors 28, 30 having a different response (different capacitance values) in response to an external stimulus. With regard to fixed reference capacitors 92, 94, the term "matched" refers to each having the same capacitance value and the term "mismatched" refers to each having different capacitance values.

Unlike first and second capacitive sensors 28, 30, reference capacitors 92, 94 are not sensitive to the stimulus to be sensed (e.g., pressure). In some configurations, amplifier 98 may be provided to remove error, e.g., common-mode charge from the excitation waveform 32 (FIG. 1) in a known manner. Amplifier 100 has a negative input connected to an input node labeled N1, a positive input connected to an input node labeled N2, a positive output and a negative output. The positive and negative outputs are labeled $V_{P(C/V)}$ and $V_{N(C/V)}$ to correspond respectively to C/V output signal 56. As illustrated, C/V output signal 56 is input to anti-aliasing filter 58 and the resulting analog output signal 60 ($V_{P(AAF)}$ and $V_{N(AAF)}$) is thereafter output from anti-aliasing filter 58.

A plurality of voltages can be provided to an input of switches 96. The plurality of voltages can include a low voltage labeled $V_{XL}$, a medium voltage labeled $V_{XM}$, and a high voltage labeled $V_{XH}$. The medium voltage $V_{XM}$ has a voltage magnitude between the magnitudes of low voltage $V_{XL}$, and high voltage $V_{XH}$. The plurality of switches 96 is provided for selectively coupling the various voltages to capacitive sensors 28, 30, reference capacitors 92, 94, and to inputs of amplifier 98 and inputs and outputs of amplifier 100 in response to clock signals that may be provided from a clock generator (not shown) in communication with C/V converter 54 and/or excitation circuit 22 (FIG. 1).

Figure 5:
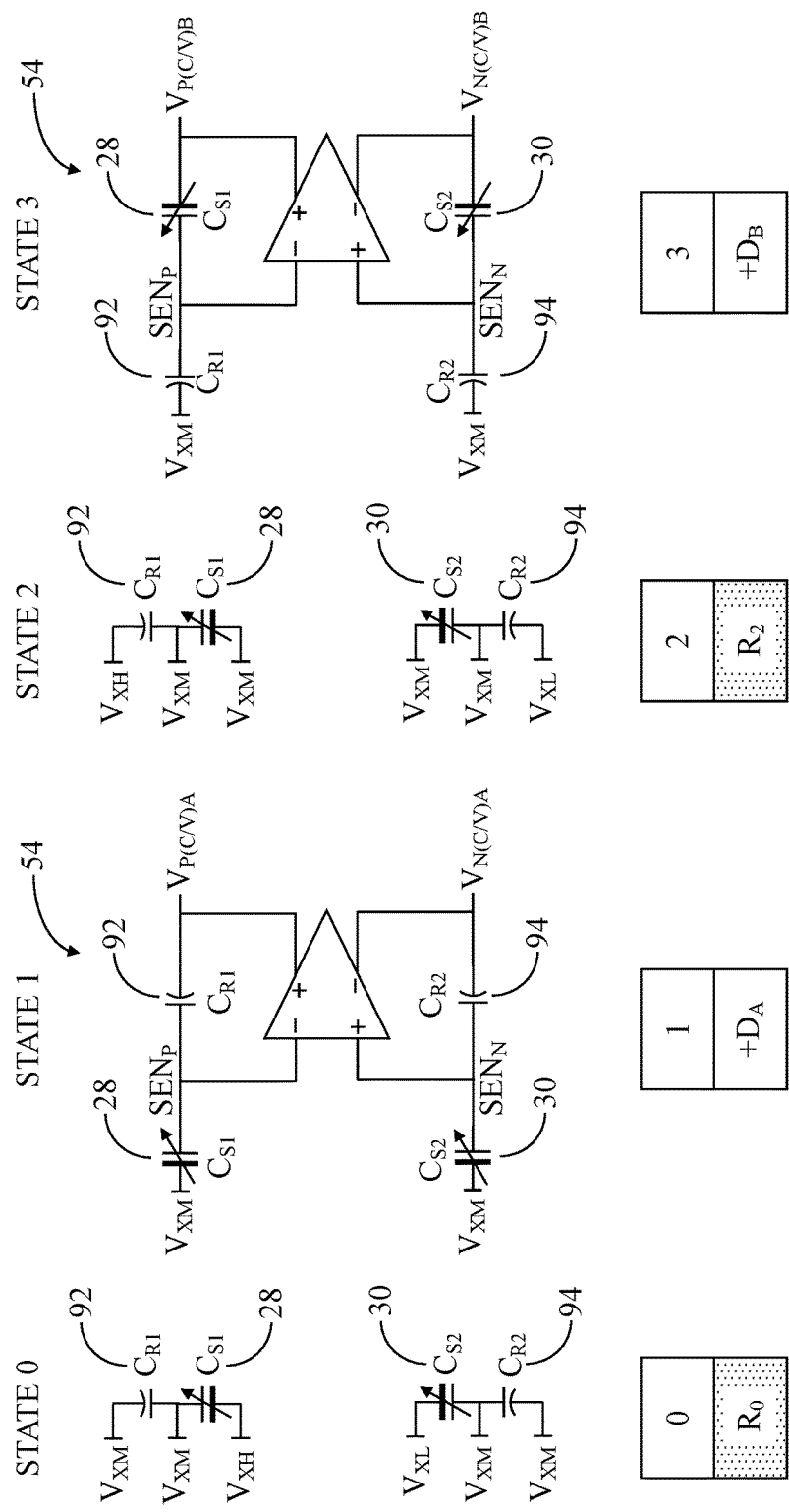
FIG. 5 shows phases of operation of the C/V converter of FIG. 4.
Figure 6:
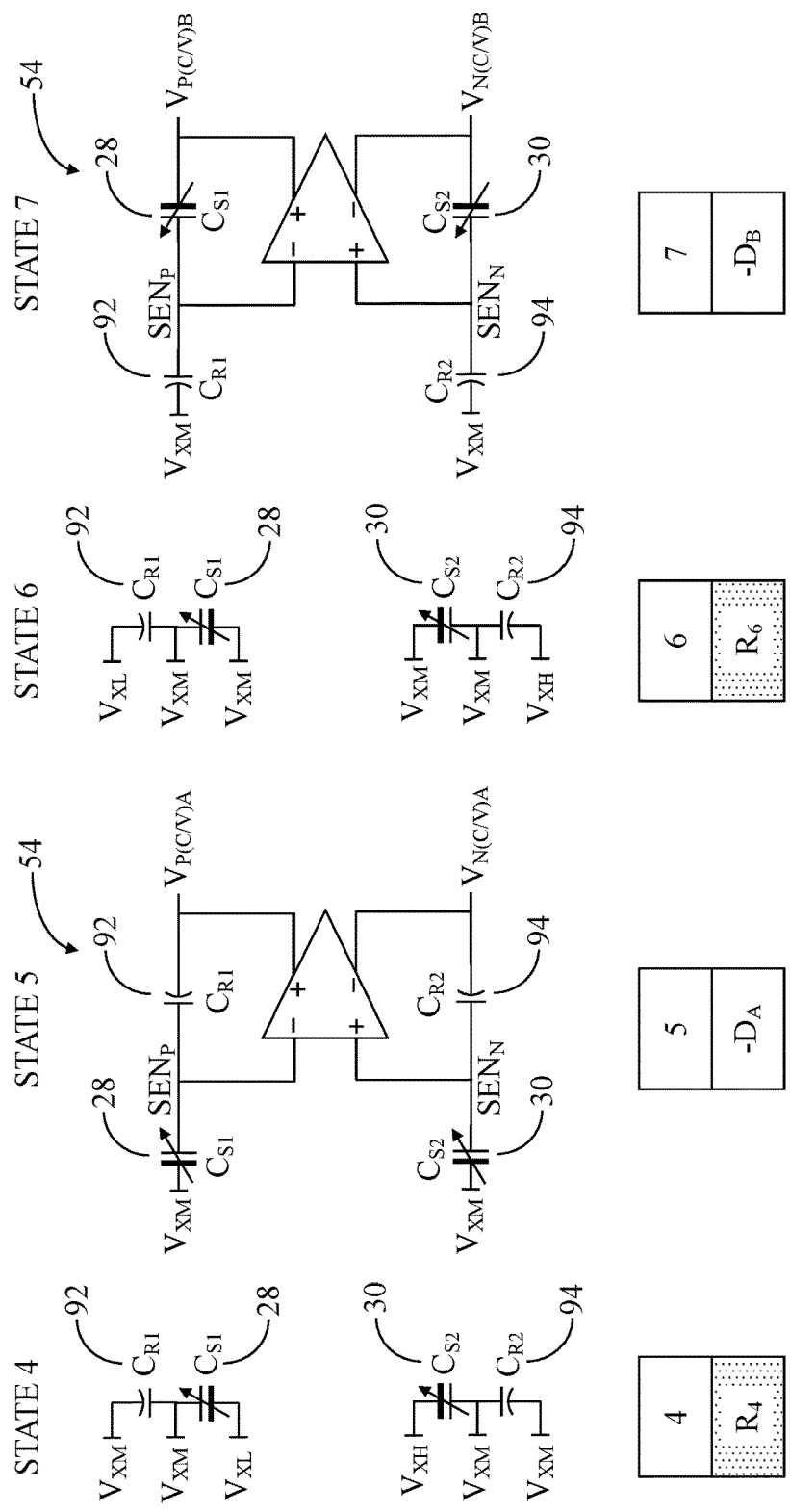
FIG. 6 shows additional phases of operation of the C/V converter of FIG. 4.

Referring to FIGS. 5 and 6, FIG. 5 shows phases of operation of C/V converter 54 and FIG. 6 shows additional phases of operation of C/V converter 54. More particularly, FIGS. 5 and 6 illustrate capacitance-voltage circuit configurations of C/V converter 54 for a differential-mode phase of operation (represented by a "D" throughout) for sensing an external stimulus via sensor device 24. In C/V converter 54, a differential-mode output signal is determined in eight states, states 0-3 shown in FIG. 5 and states 4-7 shown in FIG. 6. Signal processing is split between "A," "B," and "R" phases. In the "A" phase, reference capacitors 92, 94 are connected in feedback, and in the "B" phases, first and second capacitive sensors 28, 30 are connected in feedback via switches 96 (FIG. 4). The "A" and "B" phases are also denoted with "+" and "−" to indicate how the signal may be chopped at chopper circuit 66 to compensate for offset and flicker noise and leakage on $SEN_P$ and $SEN_N$.

In this example, a first voltage function in "A" phase, $V_{DM(C/V)A}$, is determined by closing the plurality of switches 96 so that C/V converter 54 is as depicted in State 1 of FIG. 5 (preceded by reset State 0), and the opposite voltage function is determined by closing the plurality of switches 96 so that C/V converter 54 is as depicted in State 5 of FIG. 6 (preceded by reset State 4). A second voltage function in "B" phase, $V_{DM(C/V)B}$, is determined by closing the plurality of switches 96 so that C/V converter 54 is as depicted in State 3 of FIG. 5 (preceded by reset State 2), and the opposite voltage function is determined by closing the plurality of switches 96 so that C/V converter 54 is as depicted in State 7 of FIG. 6 (preceded by reset State 6). In any of States 0, 2, 4, and 6, the reset phase, $R_n$, pre-charges C/V converter 54 to an initial condition.

The transfer functions describing C/V output signal 56 in response to a differential-mode excitation voltage is as follows:

$$V_{DM(C/V)A} = 2V_X \left( \frac{C_{S1} + C_{S2}}{C_{R1} + C_{R2}} \right) \quad (1)$$

$$V_{DM(C/V)B} = 2V_X \left( \frac{C_{R1} + C_{R2}}{C_{S1} + C_{S2}} \right) \quad (2)$$

where $V_X$ is an average of an absolute value of a difference between $V_{XH}$ and $V_{XM}$ and an absolute value of a difference between $V_{XM}$ and $V_{XL}$, (i.e., $V_X = V_{XH} - V_{XM} = V_{XM} - V_{XL}$), $C_{S1}$ and $C_{S2}$ represent the capacitance of first and second capacitive sensors 28, 30, respectively, and $C_{R1}$ and $C_{R2}$ represent the capacitance of reference capacitors 92, 94, respectively.

Figure 7:
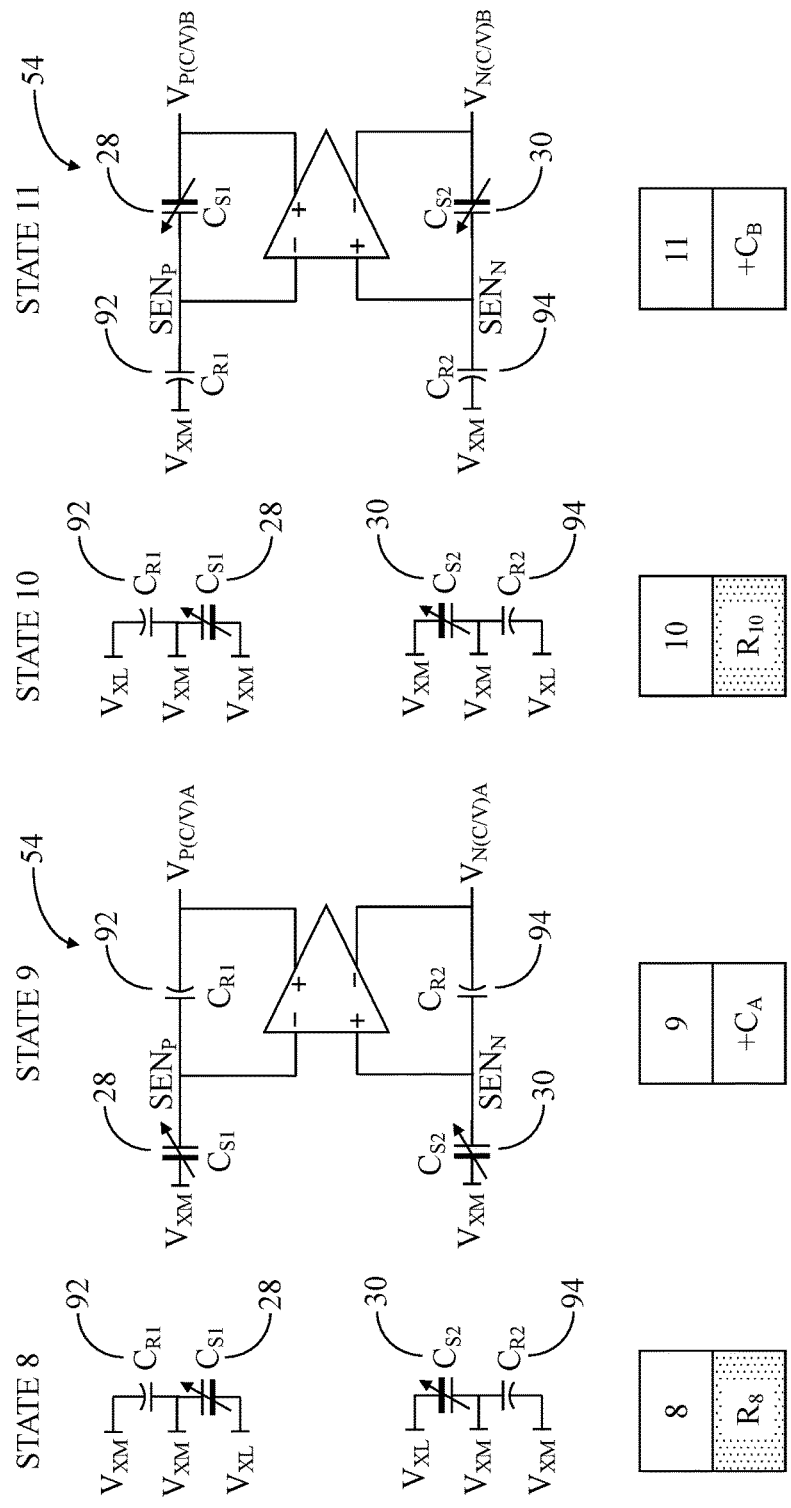
FIG. 7 shows additional phases of operation of the C/V converter of FIG. 4.
Figure 8:
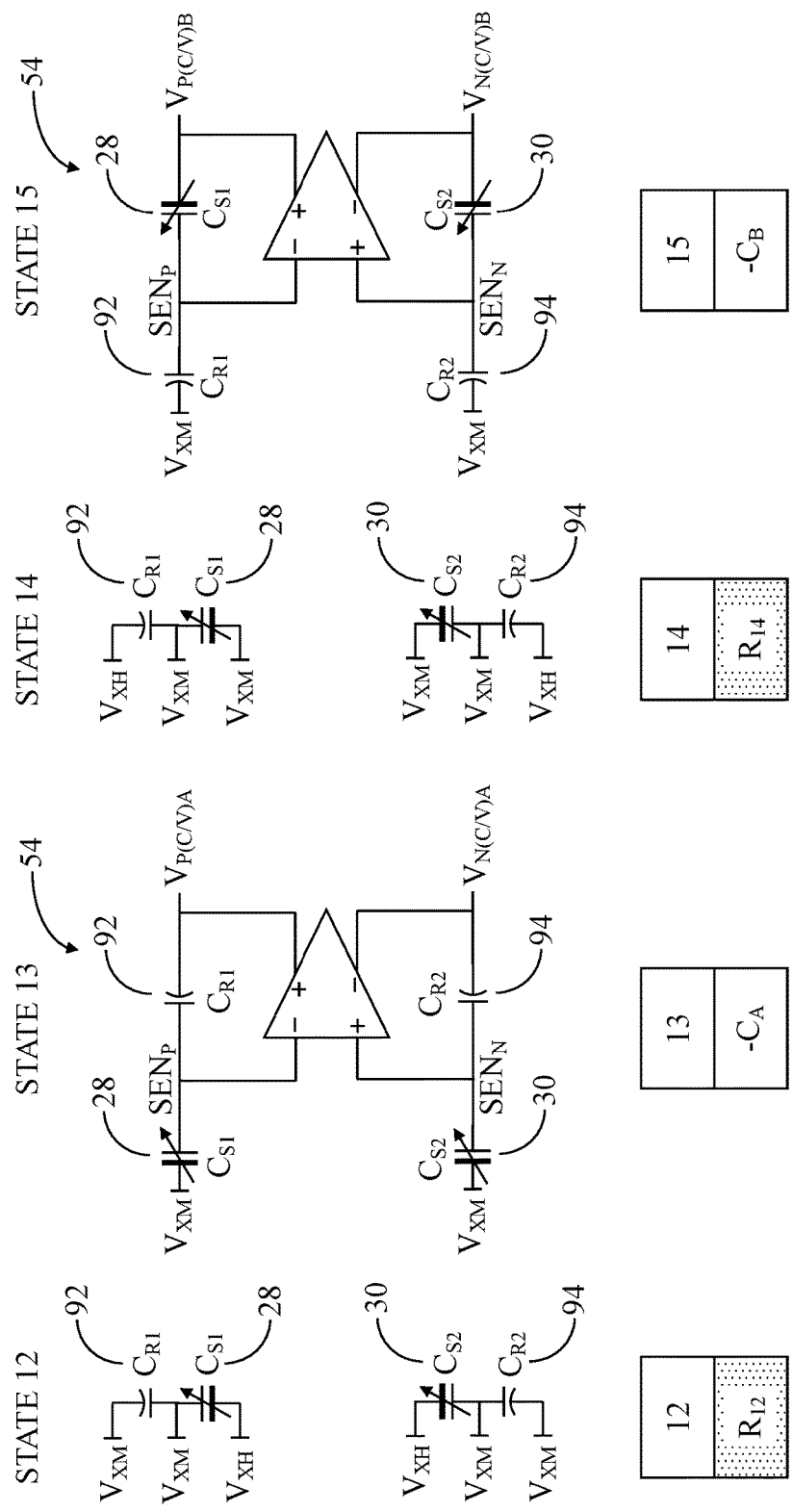
FIG. 8 shows additional phases of operation of the C/V converter of FIG. 4.

Referring now to FIGS. 7 and 8, FIG. 7 shows phases of operation of the C/V converter 54 and FIG. 8 shows additional phases of operation of the C/V 54. More particularly, FIGS. 7 and 8 illustrate capacitance-voltage circuit configurations of C/V converter 54 for a common-mode phase of operation (represented by a "C" throughout) for testing sensor device 24. In C/V converter 54, a common-mode output signal is determined in eight states, states 8-11 shown in FIG. 7 and states 12-15 shown in FIG. 8. Again, signal processing is split between "A," "B," and "R" phases. In the "A" phase, reference capacitors 92, 94 are connected in feedback, and in the "B" phases, first and second capacitive sensors 28, 30 are connected in feedback via switches 96 (FIG. 4). The "A" and "B" phases are also denoted with "+" and "−" to indicate how the signal may be chopped at chopper circuit 66 to compensate for offset and flicker noise and leakage on $SEN_P$ and $SEN_N$.

In this example, a first voltage function in "A" phase, $V_{CM(C/V)A}$, is determined by closing the plurality of switches 96 so that C/V converter 54 is as depicted in State 9 of FIG. 7 (preceded by reset State 8), and the opposite voltage function is determined by closing the plurality of switches 96 so that C/V converter 54 is as depicted in State 13 of FIG. 8 (preceded by reset State 12). A second voltage function in "B" phase, $V_{CM(C/V)B}$, is determined by closing the plurality of switches 96 so that C/V converter 54 is as depicted in State 11 of FIG. 7 (preceded by reset State 10), and the opposite voltage function is determined by closing the plurality of switches 96 so that C/V converter 54 is as depicted in State 15 of FIG. 8 (preceded by reset State 14). In any of States 8, 10, 12, 14, the reset phase, $R_n$, pre-charges C/V converter 54 to an initial condition.

The transfer functions describing C/V output signal 56 in response to a common-mode excitation voltage is as follows:

$$V_{CM(C/V)A} = 2V_X \left( \frac{C_{S1} - C_{S2}}{C_{R1} + C_{R2}} \right) \quad (3)$$

$$V_{DM(C/V)B} = 2V_X \left( \frac{C_{R1} - C_{R2}}{C_{S1} + C_{S2}} \right) \quad (4)$$

where $V_X$ is an average of an absolute value of a difference between $V_{XH}$ and $V_{XM}$ and an absolute value of a difference between $V_{XM}$ and $V_{XL}$, $C_{S1}$ and $C_{S2}$ represent the capacitance of first and second capacitive sensors 28, 30, respectively, and $C_{R1}$ and $C_{R2}$ represent the capacitance of reference capacitors 92, 94, respectively.

With regard to the above transfer functions (1), (2), (3), (4), digital data stream 72 (FIG. 3) may be characterized by the following equation:

$$ADC_{OUT} = \frac{1}{2V_{REF}\beta_1}[\alpha_{1D}(1 - \gamma_C)(V_{DM(C/V)A} - V_{DM(C/V)B}) + \alpha_{1C}\gamma_C(V_{CM(C/V)A} - V_{CM(C/V)B})] \quad (5)$$

where an ADC (and pre-filter) transfer function of the differential-mode output signal is: $\alpha_{1D}/(2V_{REF}\beta_1)$, and an ADC (and pre-filter) transfer function of the common-mode output signal is: $\alpha_{1C}/(2V_{REF}\beta_1)$, where $V_{REF}$ is the reference voltage for ADC 70 (FIG. 3). A duty cycle for the common-mode output signal processing is: $\gamma_C$ and defines how often a common-mode output signal is being injected relative to the differential-mode output signal.

Figure 9:
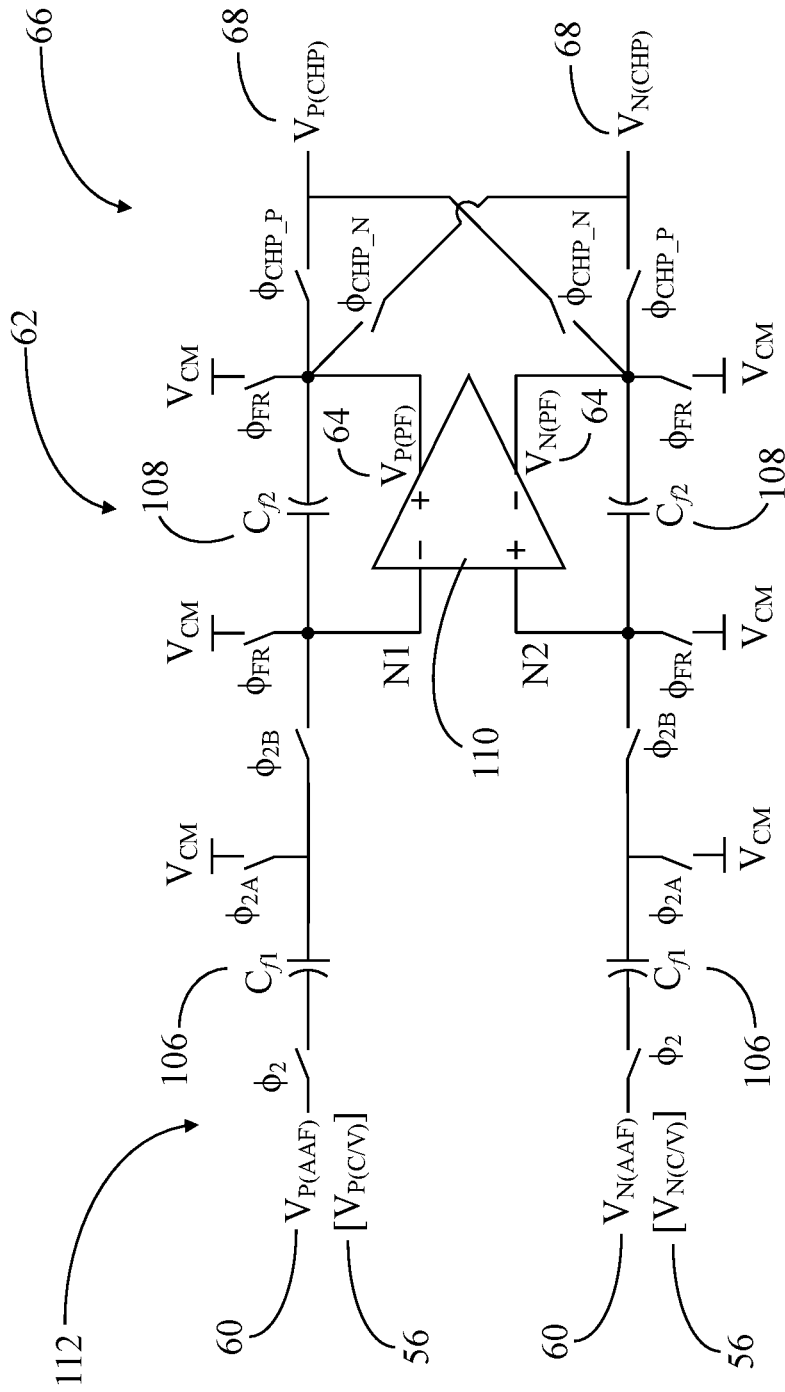
FIG. 9 shows a schematic diagram of a pre-filter and a chopper circuit of the measuring circuit.
Figure 11:
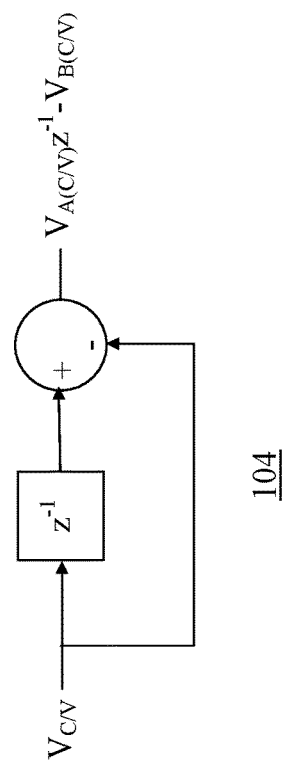
FIG. 11 shows a diagram of a z-domain description of the function of the pre-filter in a unity gain configuration.
Figure 10:
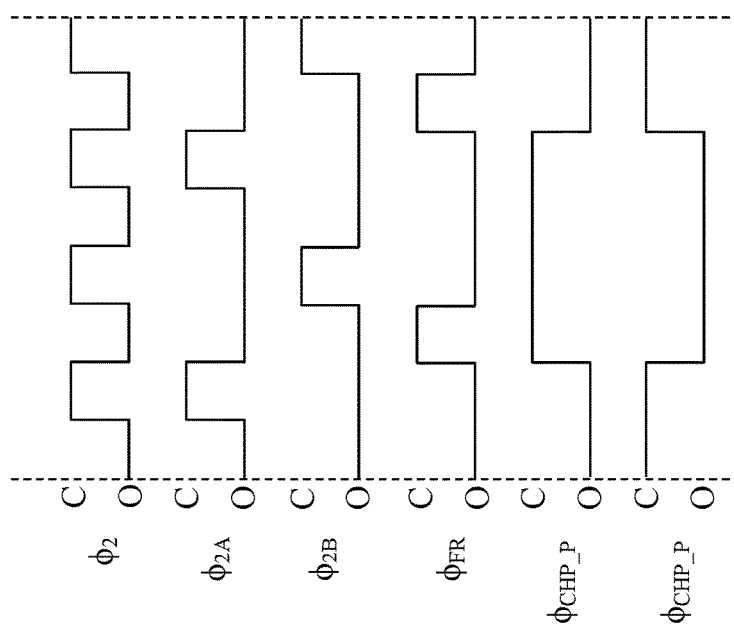
FIG. 10 shows a timing diagram of a switching function associated with the pre-filter and chopper circuit of FIG. 9.

Referring to FIGS. 9-11, FIG. 9 shows a schematic diagram of pre-filter 62 and chopper circuit 66 of the measuring circuit 26. FIG. 10 shows a timing diagram 102 of a switching function associated with pre-filter 62 and chopper circuit 66, and FIG. 11 shows a diagram 104 of a z-domain description of the function of pre-filter 62 in a unity gain configuration. Shown in FIG. 9 are input capacitors ($C_{f1}$) 106, feedback capacitors ($C_{f2}$) 108, an amplifier 110, and a plurality of switches 112 (e.g., $\phi_1$, $\phi_2$, $\phi_{2A}$, $\phi_{2B}$, $\phi_{FR}$, $\phi_{CHP\_P}$, $\phi_{CHP\_N}$). Amplifier 110 has a negative input connected to an input node labeled N1, a positive input connected to an input node labeled N2, a positive output labeled $V_{P(PF)}$, and a negative output labeled $V_{N(PF)}$. Chopper circuit 66 has an input connected to the positive output of amplifier 110 and an input connected to the negative output of amplifier 110. The plurality of switches 112 is provided for selectively coupling voltages and/or input and output interconnects in accordance with timing diagram 102, where a "O" in timing diagram 102 represents an open switch condition and a "C" in timing diagram 102 represents a closed switch condition.

In the illustrated configuration, pre-filter 62 is configured to receive output signal 60, $V_{P(AAF)}$ and $V_{N(AAF)}$, from anti-aliasing filter 58 (FIG. 3), which is, in essence, C/V output signal 56 $V_{P(C/V)}$ and $V_{N(C/V)}$. Pre-filter 62 may serve to filter intrinsic noise and harmonically-related components of the differential-mode and common-mode signals in output signal 60 and/or serve as a gain stage to enable trimming of the full scale voltage level that is to be sampled by ADC 70 (FIG. 3). In general, pre-filter 62 subtracts the related successive samples from C/V converter 54 and applies an alternate sign inversion to the result. That is, in the differential-mode, pre-filter 62 will compute $(V_{DM(C/V)A}) - (V_{DM(C/V)B})$ and multiply the result by +1. Then, pre-filter 62 will compute $(-V_{DM(C/V)A}) - (-V_{DM(C/V)B})$ and multiply the result by −1. This computation will also occur with the related successive samples in the common-mode. This process continues indefinitely. In the analog signal chain that includes C/V converter 54, signal errors known as DC offset and flicker noise (1/f noise) can be generated. Accordingly, chopper circuit 66 receives pre-filtered output signal 64 and inverts alternate samples from pre-filter 62. The DC offset and flicker noise is the same for both samples. Thus, as the sign of the first sample is swapped, the signal error will have the opposite sign. Addition of the two output signal samples at chopper circuit 66 (denoted by the z-domain description of the function of chopper circuit 66 shown in FIG. 9) results in the cancelation of the signal error (e.g., DC offset and flicker noise) to yield chopper output signal 68 ($V_{P(CHP)}$ and $V_{N(CHP)}$).

Figure 12:
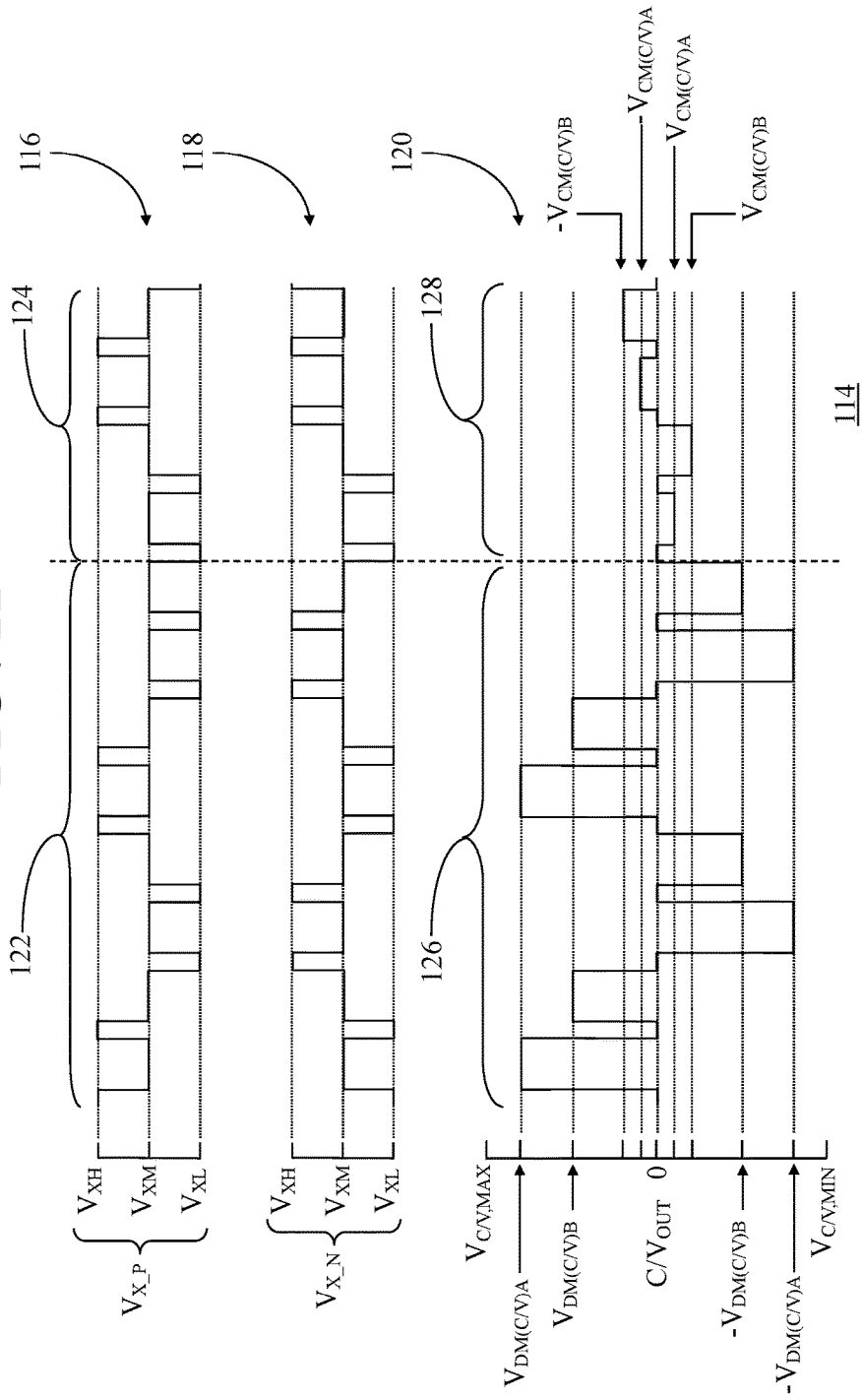
FIG. 12 shows a simplified diagram of possible excitation voltage wave forms that may be applied to the capacitive sensors of FIG. 2 and a C/V output waveform responsive to the excitation voltages.

FIG. 12 shows a simplified timing diagram 114 of possible excitation voltage waveforms 116, 118 applied to first and second capacitive sensors 28, 30 (FIG. 4) and reference capacitors 92, 94 (FIG. 4), and a C/V output waveform 120 responsive to excitation voltage waveforms 116, 118. In this example, excitation waveform 116, $V_{X\_P}$, is applied to first capacitive sensor 28 and reference capacitor 92 as denoted in FIGS. 4-8. Concurrently, excitation waveform 118, $V_{X\_N}$, is applied to second capacitive sensor 30 and reference capacitor 94 as denoted in FIGS. 4-8.

Excitation waveforms 116, 118 applied to first and second capacitive sensors 28, 30 vary in time to create a charge proportional to each of first and second capacitive sensors 28, 30. C/V converter 54 may be constructed using the differential circuit technique. In this case, first capacitive sensor 28 is connected to the positive side of C/V converter 54 and second capacitive sensor 30 is connected to the negative side of C/V converter 54.

In this example, a differential excitation component 122 of excitation waveforms 116, 118 is applied to first and second capacitive sensors 28, 30 and reference capacitors 92, 94. Differential-mode excitation component 122 is one in which excitation waveforms 116, 118 are generally equal in amplitude, but opposite in polarity. Therefore, applying differential-mode excitation component 122 of excitation waveforms 116, 118 to first and second capacitive sensors 28, 30, respectively, and reference capacitors 92, 94 produces a voltage signal at the output of C/V converter 54 that is essentially proportional to the sum of the capacitance values of first and second capacitive sensors 28, 30.

Alternatively, a common-mode excitation component 124 of excitation waveforms 116, 118 may be applied to first and second capacitive sensors 28, 30 and reference capacitors 92, 94. Common-mode excitation component 124 is one in which excitation waveforms 116, 118 are equal in amplitude and have the same polarity. Therefore, applying common-mode component 124 of excitation waveforms 116, 118 (i.e., the same excitation signal) to first and second capacitive sensors 28, 30 and reference capacitors 92, 94 produces a voltage signal at the output of C/V converter 54 that is essentially proportional to the difference of the capacitance values of first and second capacitive sensors 28, 30 and the sum of reference capacitors 92, 94.

As can be observed in C/V output waveform 120, the differential-mode excitation component 122 of first and second excitation waveforms 116, 118 thus yields a differential-mode C/V output signal 126, $V_{DM(C/V)}$. Likewise, the common-mode excitation component 124 of first and second excitation waveforms 116, 118 yields a common-mode C/V output signal 128, $V_{CM(C/V)}$.

The differential-mode excitation component 122 yields differential-mode C/V output signal 126, as follows:

$$V_{DM(C/V)A} = 2V_X \left( \frac{C_{S1} + C_{S2}}{C_{R1} + C_{R2}} \right) \quad (6)$$

$$V_{DM(C/V)B} = 2V_X \left( \frac{C_{R1} + C_{R2}}{C_{S1} + C_{S2}} \right) \quad (7)$$

$$-V_{DM(C/V)A} = -2V_X \left( \frac{C_{S1} + C_{S2}}{C_{R1} + C_{R2}} \right) \quad (8)$$

$$-V_{DM(C/V)B} = -2V_X \left( \frac{C_{R1} + C_{R2}}{C_{S1} + C_{S2}} \right) \quad (9)$$

The common-mode excitation component 124 yields common-mode C/V output signal 128, as follows:

$$V_{CM(C/V)A} = 2V_X \left( \frac{C_{S1} - C_{S2}}{C_{R1} + C_{R2}} \right) \quad (10)$$

$$V_{CM(C/V)B} = 2V_X \left( \frac{C_{R1} - C_{R2}}{C_{S1} + C_{S2}} \right) \quad (11)$$

$$-V_{CM(C/V)A} = -2V_X \left( \frac{C_{S1} - C_{S2}}{C_{R1} + C_{R2}} \right) \quad (12)$$

$$-V_{CM(C/V)B} = -2V_X \left( \frac{C_{R1} - C_{R2}}{C_{S1} + C_{S2}} \right) \quad (13)$$

Figure 13:
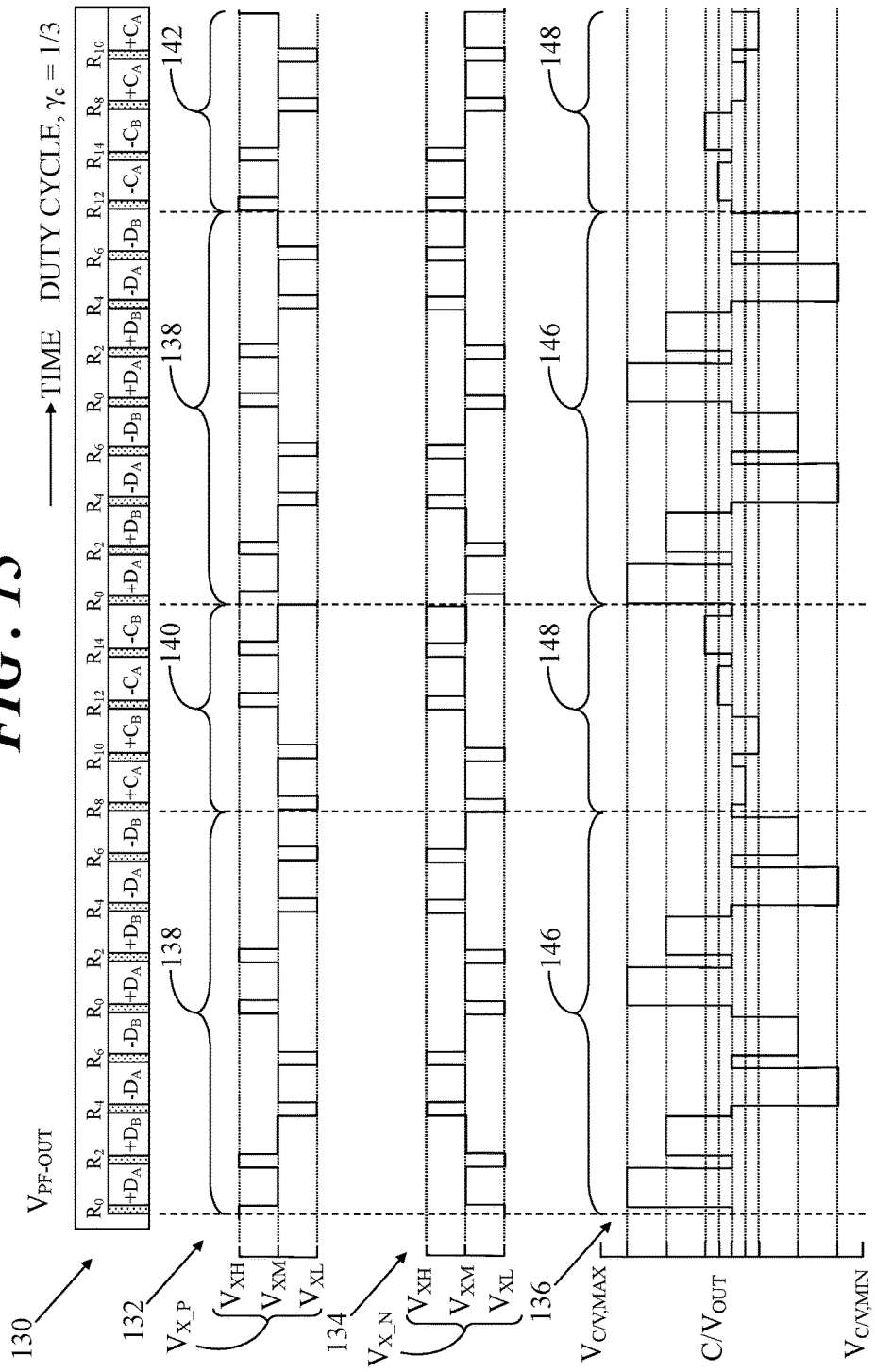
FIG. 13 shows a diagram of a period of the multiple phases of operation shown in FIGS. 5-8 along with the resulting excitation waveforms and a resulting C/V output waveform.

FIG. 13 shows a diagram of a period 130 of the multiple phases of operation shown in FIGS. 5-8 along with the resulting first and second excitation voltage waveforms 132, 134 and a resulting C/V output waveform 136. By suitably arranging the various states/phases (numbered 0-15) described in detail above in connection with FIGS. 5-8, first excitation voltage waveforms 132, 134 are generated that include a first excitation component in the form of a differential-mode excitation component 138, a second excitation component in the form of a first common-mode excitation component 140, and a third excitation component in the form of a second common-mode excitation component 142.

That is, excitation circuit 22 (FIG. 1) generates and multiplexes differential-mode excitation component 138, first common-mode excitation component 140, and second common-mode excitation component 142 by separating excitation components 138, 140, 142 in time to form excitation voltage waveforms 132, 134. In an embodiment, excitation circuit 22 produces excitation voltage waveforms 132, 134, each of which sequentially includes a first occurrence of differential-mode excitation component 138, first common-mode excitation component 140, a second occurrence of differential-mode excitation component 138, and second common-mode excitation component 142. FIG. 13 only shows a single period 130 of this time-multiplexed pattern of differential-mode and common-mode components 138, 140, 138, 142 for simplicity. It should be understood, however, that this time-multiplexed pattern may be continuously repeated for a multiplicity of periods 130.

It should be further observed in FIG. 13 that first and second common-mode excitation components 140, 142 of excitation voltage waveforms 132, 134 are generated to have opposite polarities. In other words, first common-mode excitation component 140 is the same magnitude for both of excitation voltage waveforms 132, 134. Likewise, second common-mode excitation component 142 is the same magnitude for both of excitation voltage waveforms 132, 134. However as shown in FIG. 13, second common-mode excitation component 142 is of opposite polarity (i.e., flipped) relative to first common-mode excitation component 140. The application of first and second common-mode excitation components 140, 142 alternately in positive and negative polarities will position the common-mode output signal (i.e., diagnostic signal 40) above the frequency band where the differential-mode output signal (i.e. sense signal 38) spans.

In an embodiment, excitation circuit 22 (FIG. 1) is configured to apply differential-mode excitation component 138 of first and second voltage waveforms 132, 134 for a first duration of time, apply first common-mode excitation component 140 for a second duration of time, and apply second common-mode excitation component 142 for the second duration of time, where the second duration of time is generally less than the first duration of time. In this example, the duty cycle, $\gamma_C$, of application of first and second common-mode components 140, 142 is one-third. As such, two-thirds of period 130 may be dedicated to sensing the stimulus in a differential-mode of operation and one-third of period 130 may be dedicated to fault detection in a common-mode of operation in the time-multiplexed application of differential-mode excitation component 138 and common-mode excitation components 140, 142.

In response to the two application instances of differential-mode excitation component 138, C/V output waveform 136 produced by C/V converter 54 (FIG. 3) includes two occurrences of a differential-mode C/V output signal 146 and two occurrences of a common-mode C/V output signal 148 having opposite polarities.

Figure 14:
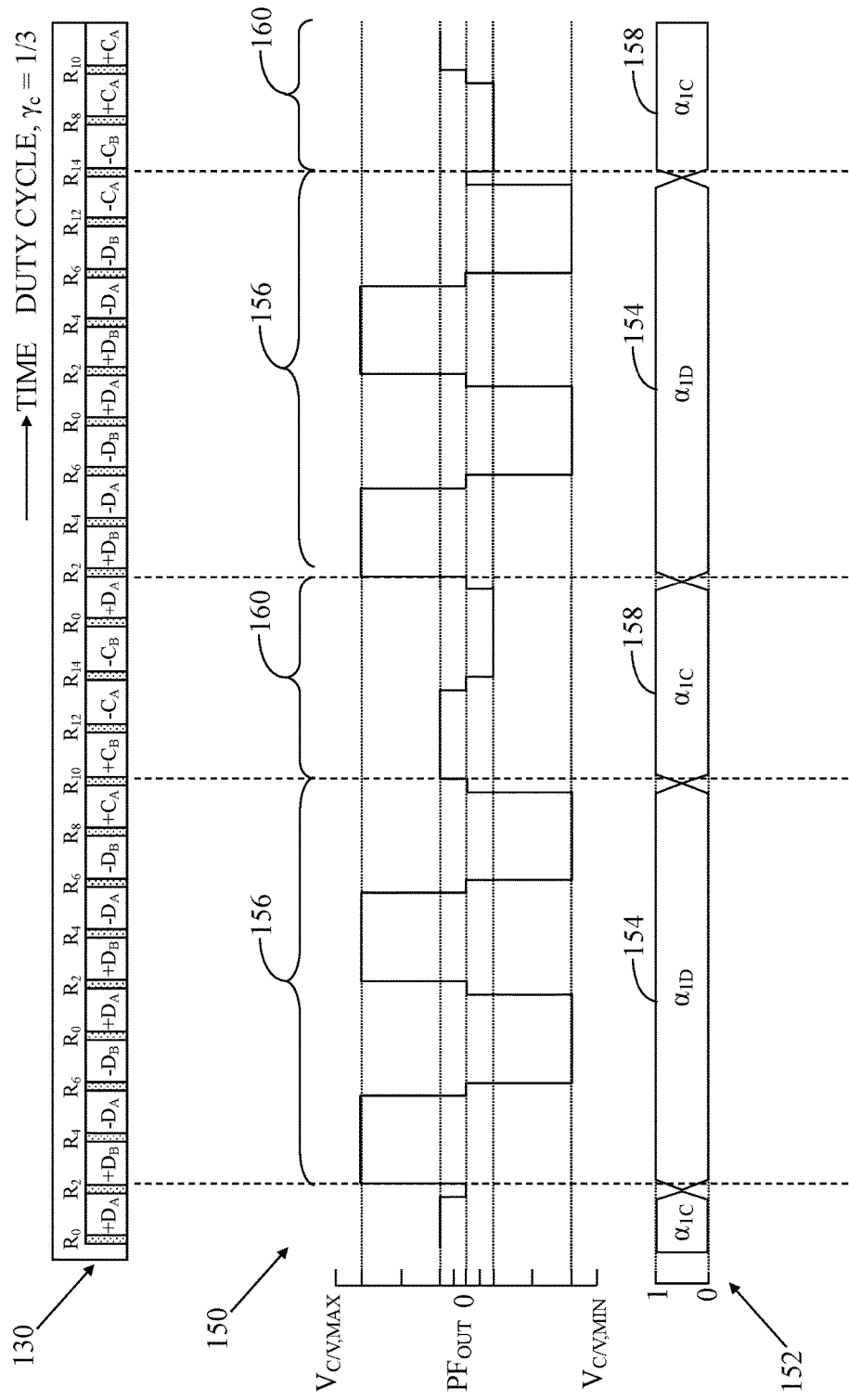
FIG. 14 shows a diagram of a period of the multiple phases of operation shown in FIGS. 5-8 and a resulting pre-filter output waveform.

FIG. 14 shows a diagram of period 130 of the multiple phases of operation shown in FIGS. 5-8 along with a resulting pre-filter output waveform 150. In particular, FIG. 14 shows a timing chart 152 illustrating application of a differential-mode gain factor 154, am, that may be applied at pre-filter 62 to differential-mode C/V output signal 146

(FIG. 13) to yield a differential-mode pre-filter output signal 156. Similarly, timing chart 152 illustrates application of a common-mode gain factor 158, $\alpha_{1C}$, that may be applied at pre-filter 62 to common-mode C/V output signal 148 (FIG. 13) to yield a common-mode pre-filter output signal 160 (i.e., the positive and negative common-mode response).

Figure 15:
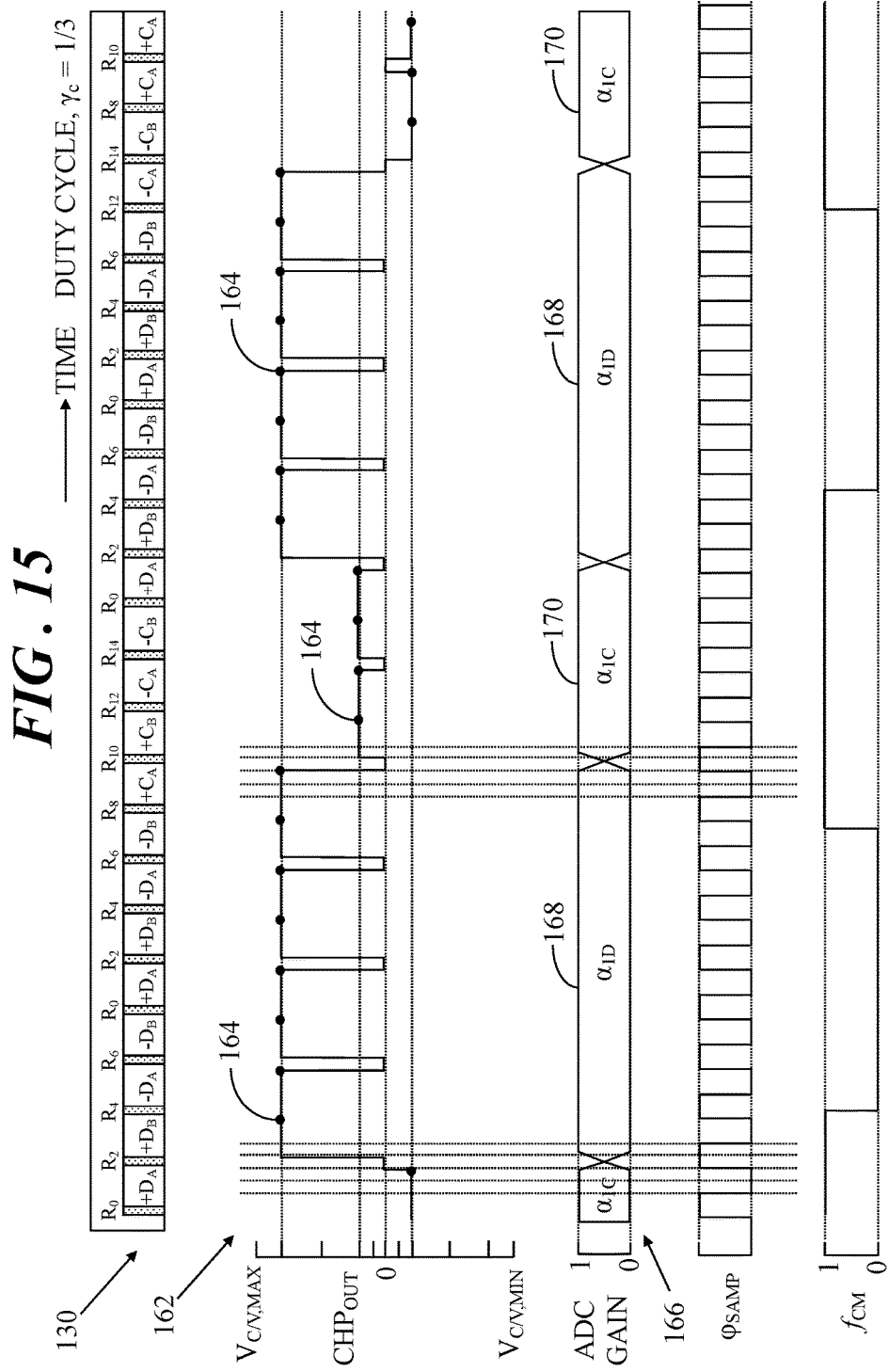
FIG. 15 shows a diagram of a period of the multiple phases of operation shown in FIGS. 5-8, a resulting chopper output waveform, and sampling of the chopper output waveform by an analog-to-digital converter (ADC) of the measuring circuit.

FIG. 15 shows a diagram of period 130 of the multiple phases of operation shown in FIGS. 5-8 along with a resulting chopper output waveform 162, and sampling of the chopper output waveform by ADC 70 (FIG. 3) of measuring circuit 26 (FIG. 3). Dots 164 superimposed on chopper output waveform 162 represent sampling instances performed at ADC 70. FIG. 15 also shows a timing chart 166 illustrating application of a differential-mode gain factor 168, am, that may optionally or alternatively be applied at ADC 70 to differential-mode pre-filter output signal 156 (FIG. 14). Similarly, timing chart 166 illustrates application of a common-mode gain factor 170, $\alpha_{1C}$, that may optionally or alternatively be applied at ADC 70 to common-mode pre-filter output signal 160 (FIG. 14). The state diagram labeled $\varphi_{SAMP}$ represents the ADC clock signal. Additionally, the state diagram labeled $f_{CM}$ represents a demodulator frequency for extracting diagnostic signal 40 (FIG. 3) from data stream 72 (FIG. 3) output from ADC 70.

To summarize, time-multiplexed excitation waveforms are applied to first and second capacitors 28, 30 of sensor device 24 and alternately to reference capacitors 92, 94. The analog front end of sensor system 20 including C/V converter 54, anti-aliasing filter 58, pre-filter 62, and chopper circuit 66 suitably processes the differential-mode and common-mode components of an analog output signal. This analog output signal is received at ADC 70, which converts it to digital data stream 72. Digital data stream 72 is communicated to signal processing unit 74. At signal processing unit 74, first decimation filter 76, first compensation circuit 78, and first low pass filter 80 suitably process the received digital data stream 72 to extract the differential-mode sense signal 38 from digital data stream 72. Conversely, demodulator 82, second decimation filter 84, second low pass filter 86, and second compensation unit 88 suitably process the received digital data stream 72 to extract the common-mode diagnostic signal 40. Sense signal 38 and diagnostic signal 40 can be compared against one another at fault assessment circuit 90 to determine whether a fault has occurred.

Figure 16:
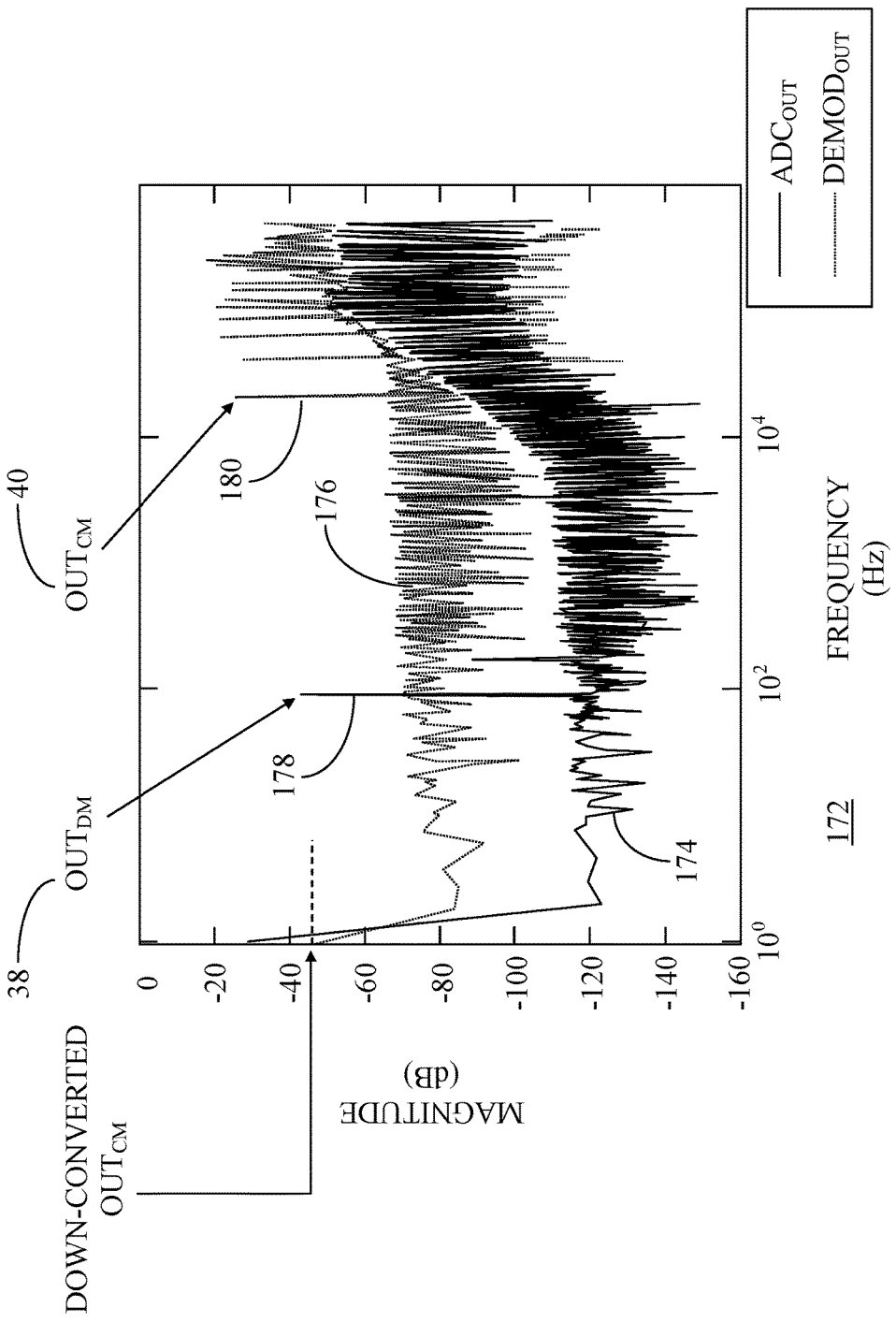
FIG. 16 shows a graph of an output of the ADC relative to the output of a demodulator of a signal processing unit.

FIG. 16 shows a graph 172 of an output of ADC 70 (FIG. 3) relative to the output of demodulator 82 (FIG. 3) of signal processing unit 74. In particular, a solid variable line 174 represents digital data stream 72 output from ADC 70 and a dotted variable line 176 represents a demodulated output signal from demodulator 82. A peak 178 of solid variable line 174 represents the differential-mode output signal 38, $OUT_{DM}$, at its fundamental frequency. Conversely, a peak 180 of dotted variable line 176 represents the common-mode output signal 40, $OUT_{CM}$, at its fundamental frequency. As shown, the fundamental frequency of the common-mode output signal is greater than the fundamental frequency of the differential-mode output signal. The greater fundamental frequency of the common-mode output signal is due to application of common-mode excitation components 140, 142 (FIG. 13) at opposite polarities (i.e., in positive and negative transitions). As such, the fundamental frequency of the common-mode output signal is positioned above the sense signal measurement frequency band of interest. Thus, sense signal 38 (FIG. 3) can be extracted from digital data stream 72 by low-pass filtering and diagnostic signal 40 (FIG. 3) can be extracted by demodulation and low pass filtering.

Figure 17:
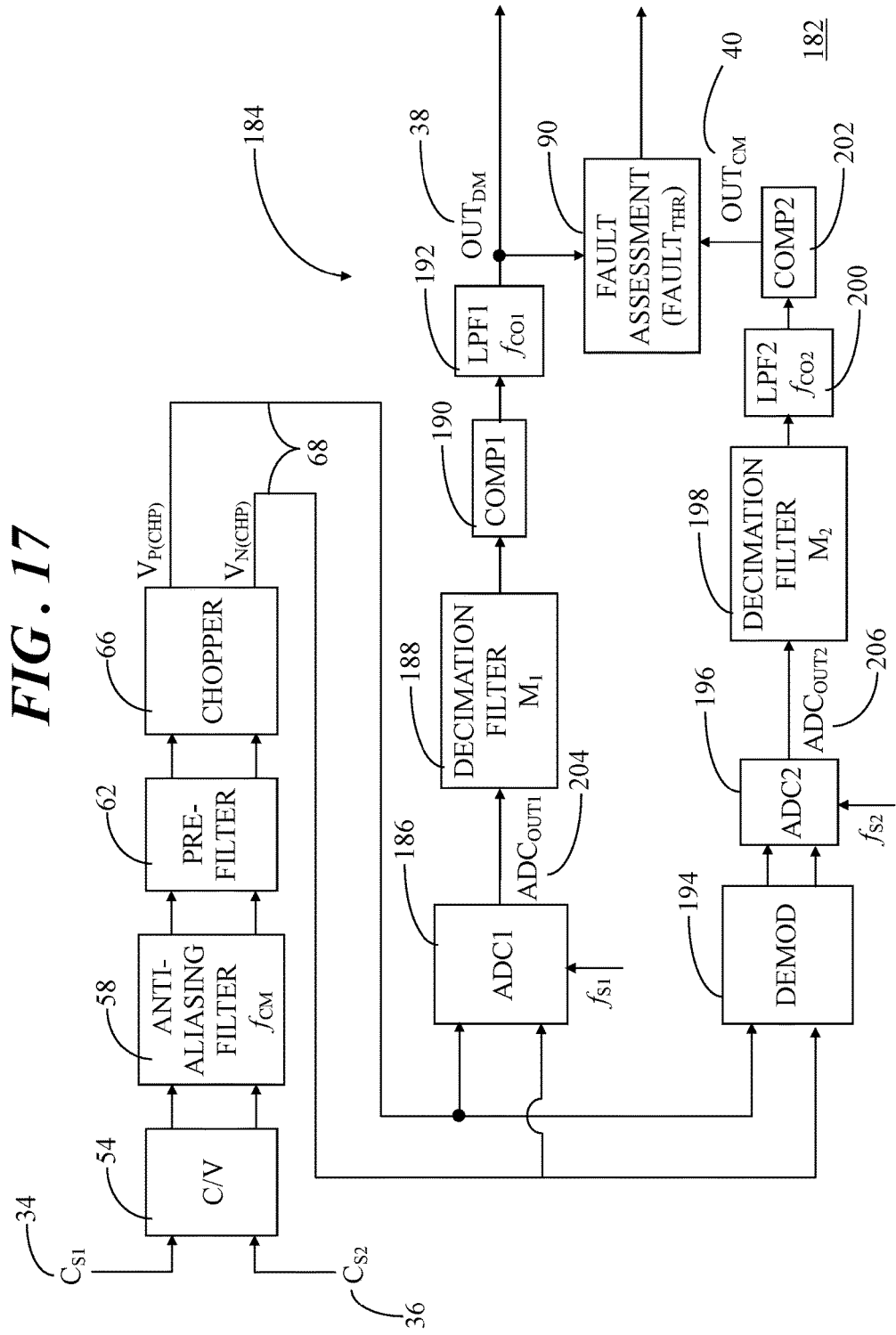
FIG. 17 shows a block diagram of a measuring circuit in accordance with another embodiment.

FIG. 17 shows a block diagram of a measuring circuit 182 in accordance with another embodiment. Measuring circuit 182 includes an equivalent analog front end as measuring circuit 26 (FIG. 3). That is, measuring circuit 182 includes C/V converter 54, anti-aliasing filter 58, pre-filter 62, and chopper 66. A description of these components will not be repeated herein for brevity. In this architecture, a signal processing unit 184 includes a first ADC 186, a first decimation filter 188, a first compensation circuit 190, and a first low pass filter 192. Additionally, signal processing unit 174 includes a demodulator 194, a second ADC 196, a second decimation filter 198, a second low pass filter 200, and a second compensation circuit 202.

In this embodiment, an output of chopper circuit 66 is coupled to an input of each of first ADC 186 and demodulator 194. Thus, first ADC 186 is configured to receive and digitize chopper output signal 68 to produce a first data stream 204, $ADC_{OUT1}$. Thereafter, first decimation filter 188, first compensation unit 190, and first low pass filter 192 suitably process first data stream 204 to extract sense signal 38. Likewise, demodulator 194 is configured to receive and demodulate chopper output signal 68. Second ADC 196 is configured to receive and digitize the demodulated chopper output signal to produce a second data stream 206, $ADC_{OUT2}$. Thereafter, second decimation filter 198, second low pass filter 200, and second compensation unit 202 suitably process second data stream 206 to extract diagnostic signal 40 for comparison with sense signal 38 at fault assessment circuit 90.

The architecture of FIG. 17 enables the optimization of first and second ADCs 186, 196 independently from one another for the differential-mode and common-mode output signals. Additionally, a larger bandwidth for second low pass filter 200 may be obtained for a similar signal-to-noise ratio (SNR) which implies a faster response time.

Figure 18:
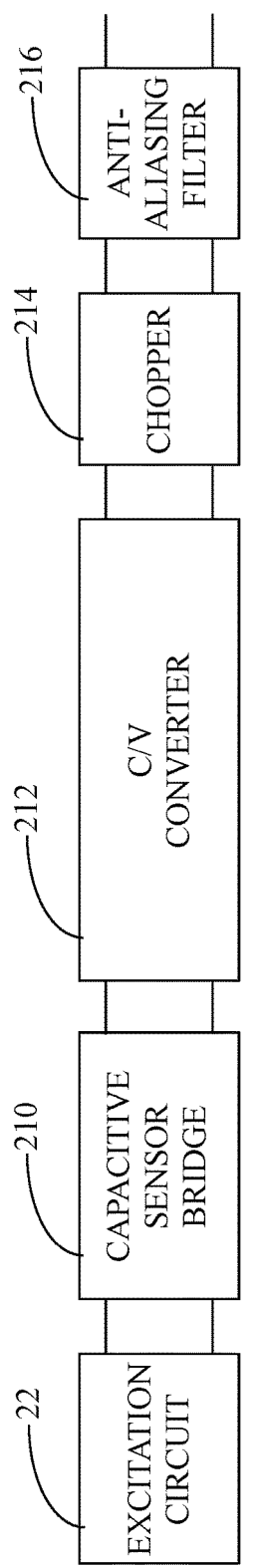
FIG. 18 shows a simplified block diagram of a sensor system in accordance with another embodiment.
Figure 19:
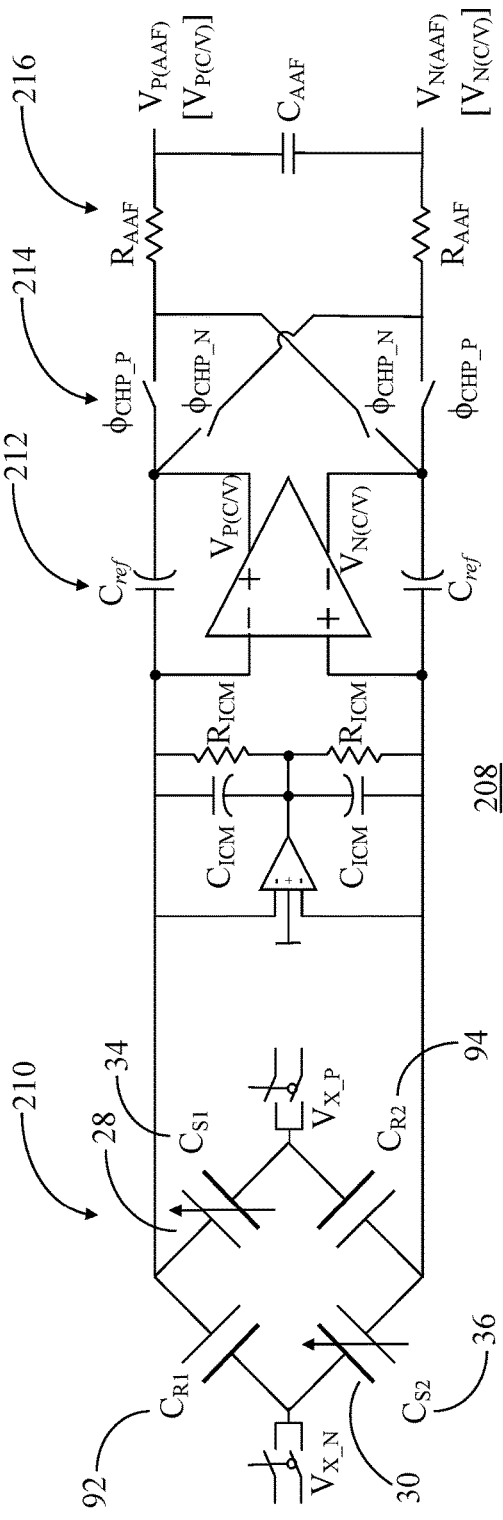
FIG. 19 shows a simplified schematic diagram of the sensor system of FIG. 18.

Referring now to FIGS. 18 and 19, FIG. 18 shows a simplified block diagram of a sensor system 208 in accordance with another embodiment and FIG. 19 shows a simplified schematic diagram of sensor system 208. Sensor system 208 includes excitation circuit 22, a capacitive bridge sensor device 210, a C/V converter 212, a chopper circuit 214, and an anti-aliasing filter 216. Capacitive bridge sensor device 210 includes first and second capacitors 28, 30 (that produce variable first and second capacitances 34, 36), and first and second fixed reference capacitors 92, 94 interconnected as a full bridge. The same architecture for processing the differential-mode and common-mode output signals including one or more ADCs and a signal processing unit as described in detail above may be applied to a sensor device configured as a full capacitive bridge sensor device. The architecture shown in FIGS. 18 and 19 may enable an alternative C/V converter implementation than that shown in FIG. 4. This alternative architecture may be useful in applications (e.g., an accelerometer) where the capacitance change is much smaller.

Figure 20:
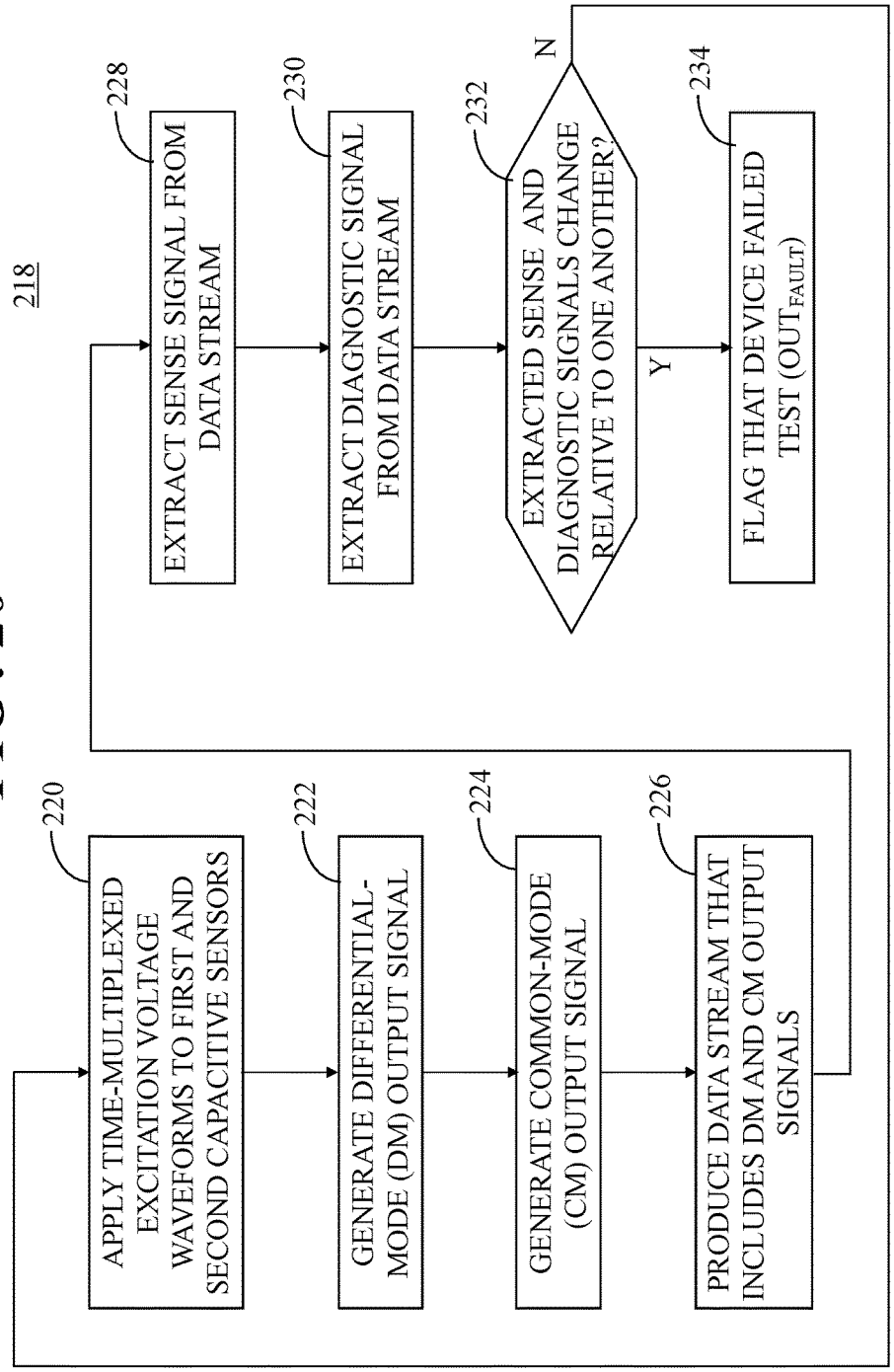
FIG. 20 shows a flowchart of a method for continuous fault detection monitoring of a sensor device.

FIG. 20 shows a flowchart of a method 218 for continuous fault detection monitoring of a sensor device implemented in accordance with the architectures described above. At a block 220, time-multiplexed excitation voltage waveforms are applied to independent capacitive sensors (e.g., first and second capacitive sensors 28, 30) and to reference capacitors 92, 94. That is, the time-multiplexed excitation waveforms are characterized by a differential-mode excitation voltage component, a first common-mode excitation voltage component, and a second common-mode excitation voltage component in which the first and second common-mode excitation voltage components are opposite in polarity.

Further, the differential-mode and common-mode excitation voltage components are time-multiplexed to include a first occurrence of the differential-mode excitation voltage component, the first common-mode excitation voltage component, a second occurrence of the differential-mode excitation voltage component, the second common-mode excitation voltage component per time period with, for example, the duty cycle of application of the first and second common-mode excitation voltage components being ⅓. Although a duty cycle of ⅓ is mentioned herein, a smaller value or a larger value may alternatively be implemented. A smaller value of the duty cycle may increase the signal-to-noise ratio (SNR) of the differential-mode signal at the expense of the signal level of the common-mode signal. This implies that a lower cut-off frequency may be needed in the common-mode processing path to get the same SNR, and which implies a longer fault detection time. On the other hand, a larger value of the duty cycle may decrease the SNR of the differential-mode signal, but improves the fault detection performance.

At a block 222, a differential-mode output signal is generated via processing at the analog front end of the measuring circuit in response to application of differential-mode excitation components of the excitation voltage waveforms. At a block 224, a common-mode output signal is generated via processing at the analog front end of the measuring circuit in response to application of common-mode excitation components of the excitation voltage waveforms.

At a block 226, one or more digital data streams are produced via analog-to-digital data conversation. The digital data stream may include differential-mode and output-mode output signal components. At a block 228, sense signal 38 is extracted from the digital data stream via a first low pass filter within the signal processing unit of the measuring circuit. At a block 230, diagnostic signal 40 is extracted from the digital data stream via demodulation and a second low pass filter within the signal processing unit of the measuring circuit. At a decision block 232, the extracted sense and diagnostic signals 38, 40 are compared to determine whether they have changed relative to one another. When there is no change, the NO path is taken to return to block 220 for continuous fault monitoring. However, when a change is determined that is outside of a preset limit, then the YES path is taken to a block 234. At 234, an indication, such as a flag is set indicating that the sensor system has failed the testing (i.e., a fault has been detected within the system).

Embodiments described herein entail a sensor system and methodology for continuous fault monitoring of the sensor system. An embodiment of a sensor system comprises a first capacitive sensor, a second capacitive sensor, and an excitation circuit electrically coupled with the first and second capacitive sensors, the excitation circuit being configured to apply an excitation voltage to each of the first and second capacitive sensors, the excitation voltage being characterized by a first excitation voltage component, a second excitation voltage component, and a third excitation voltage component, the second and third excitation voltage components having opposite polarities. A capacitance-to-voltage (C/V) converter is electrically coupled with the first and second capacitive sensors, the C/V converter being configured to generate a differential-mode output signal in response to the first excitation voltage component applied to the first and second capacitive sensors, and the C/V converter being further configured to generate a common-mode output signal in response to the second and third excitation voltage components applied to the first and second capacitive sensors. A signal processing unit is electrically coupled with the C/V converter, the signal processing unit being configured to extract a sense signal from the differential-mode output signal, extract a diagnostic signal from the common-mode output signal, and detect a fault condition in the sensor system when a difference between the sense signal and the diagnostic signal is outside a predetermined limit.

An embodiment of a method for testing a sensor system comprising a first capacitive sensor and a second capacitive sensor, the method comprising applying an excitation voltage to each of the first and second capacitive sensors, the excitation voltage being characterized by a first excitation voltage component, a second excitation voltage component, and a third excitation voltage component, the second and third excitation voltage components having opposite polarities, extracting a sense signal from the first and second capacitive sensors in response to the first excitation voltage component, extracting a diagnostic signal from the first and second capacitive sensors in response to the second and third excitation components, and detecting a fault condition in the sensor system when a difference between the sense signal and the diagnostic signal is outside a predetermined limit.

An embodiment of a sensor system comprises a first capacitive sensor, a second capacitive sensor, and an excitation circuit electrically coupled with the first and second capacitive sensors, the excitation circuit being configured to apply an excitation voltage to each of the first and second capacitive sensors, the excitation voltage being characterized by a first excitation voltage component, a second excitation voltage component, and a third excitation voltage component, the second and third excitation voltage components having opposite polarities, wherein the excitation circuit is configured to multiplex the first, second, and third excitation voltage components by separating the first, second, and third excitation voltage components in time to form the excitation voltage, and the excitation circuit is configured to apply the first excitation voltage component to the first and second capacitive sensors in a differential-mode of operation and apply the second and third voltage components to the first and second capacitive sensors in a common-mode of operation. A capacitance-to-voltage (C/V) converter is electrically coupled with the first and second capacitive sensors, the C/V converter being configured to generate a differential-mode output signal in response to the first excitation voltage component applied to the first and second capacitive sensors, and the C/V converter being further configured to generate a common-mode output signal in response to the second and third excitation voltage components applied to the first and second capacitive sensors. A signal processing unit is electrically coupled with the C/V converter, the signal processing unit being configured to extract a sense signal from the differential-mode output signal, extract a diagnostic signal from the common-mode output signal, and detect a fault condition in the sensor system when a difference between the sense signal and the diagnostic signal is outside a predetermined limit.

The sensor system and methodology enable generation of a desired sense signal and a diagnostic signal for fault monitoring by a time-multiplexed application of differential-mode and common-mode excitation voltage waveforms to the sensor device. Accordingly, the same measuring circuitry may be utilized to process the sense signal and the diagnostic signal without interruption of the measurement of the sense signal or a lapse in fault monitoring. Further, the configuration entails demodulation and filtering of a common output data stream to separate the sense signal from the diagnostic signal. Thus, the architecture may be implemented in a number of safety applications that require low-cost, continuous fault monitoring of MEMS sensors in which fault monitoring does not impact measurement of the desired signal.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A sensor system comprising:
    a first capacitive sensor;
    a second capacitive sensor;
    an excitation circuit electrically coupled with said first and second capacitive sensors, said excitation circuit being configured to apply an excitation voltage to each of said first and second capacitive sensors, said excitation voltage being characterized by a first excitation voltage component, a second excitation voltage component, and a third excitation voltage component, said second and third excitation voltage components having opposite polarities; and
    a capacitance-to-voltage (C/V) converter electrically coupled with said first and second capacitive sensors, said C/V converter being configured to generate a differential-mode output signal in response to said first excitation voltage component applied to said first and second capacitive sensors, and said C/V converter being further configured to generate a common-mode output signal in response to said second and third excitation voltage components applied to said first and second capacitive sensors; and
    a signal processing unit electrically coupled with said C/V converter, said signal processing unit being configured to extract a sense signal from said differential-mode output signal, extract a diagnostic signal from said common-mode output signal, and detect a fault condition in said sensor system when a difference between said sense signal and said diagnostic signal is outside a predetermined limit.

2. The sensor system of claim 1 wherein said excitation circuit is configured to multiplex said first, second, and third excitation voltage components by separating said first, second, and third excitation voltage components in time to form said excitation voltage.

3. The sensor system of claim 2 wherein said excitation circuit is further configured to produce a waveform of said excitation voltage that sequentially includes a first occurrence of said first excitation voltage component, said second excitation voltage component, a second occurrence of said first excitation voltage component, and said third excitation voltage component.

4. The sensor system of claim 1 wherein said excitation circuit is configured to apply said first excitation voltage component for a first duration of time, apply said second excitation voltage component for a second duration of time, and apply said third excitation voltage component for said second duration of time, said second duration being less than said first duration.

5. The sensor system of claim 1 wherein said excitation circuit is configured to apply said first excitation voltage component to said first and second capacitive sensors in a differential-mode of operation to produce said differential-mode output signal, and apply said second and third voltage components to said first and second capacitive sensors in a common-mode of operation to produce said common-mode output signal.

6. The sensor system of claim 5 wherein said differential-mode output signal and said common-mode output signal are output from said C/V converter as a data stream, and said signal processing unit comprises:
    a first filter circuit configured to receive said data stream and extract said sense signal from said data stream;
    a demodulator configured to receive said data stream and demodulate said data stream to produce a demodulated data stream; and
    a second filter circuit electrically coupled to said demodulator and configured extract said diagnostic signal from said demodulated data stream.

7. The sensor system of claim 6 wherein said sensor system further comprises an analog-to-digital converter (ADC) having an input electrically coupled to said C/V converter and having an output electrically coupled to each of said first filter circuit and said demodulator, said ADC being configured to convert said data stream to a digital data stream, said digital data stream being processed by each of said first and second filter circuits.

8. The sensor system of claim 6 wherein said sensor system further comprises:
    a first ADC having an input electrically coupled to said C/V converter and having an output electrically coupled to said first filter circuit, said first ADC being configured to convert said data stream to a first digital data stream, said first digital data stream being processed by said first filter circuit; and
    a second ADC having an input electrically coupled to said demodulator and having an output electrically coupled to said second filter circuit, said second ADC being configured to convert said demodulated data stream to a second digital data stream, said second digital data stream being processed by said second filter circuit.

9. The sensor system of claim 6 wherein:
    said first filter circuit comprises a first decimation filter and a first low pass filter electrically coupled to said first decimation filter, said first decimation filter and said first low pass filter being operatively coupled to receive said data stream and remove said diagnostic signal from said data stream to extract said sense signal; and
    said second filter circuit comprises a second decimation filter and a second low pass filter electrically coupled to said second decimation filter, said second decimation filter and said second low pass filter being operatively coupled to receive said demodulated data stream and remove said sense signal from said demodulated data stream to extract said diagnostic signal.

10. The sensor system of claim 1 further comprising first and second fixed reference capacitors, wherein said first and second capacitive sensors and said first and second fixed reference capacitors are arranged in a capacitive bridge configuration.

11. A method for testing a sensor system comprising a first capacitive sensor and a second capacitive sensor, said method comprising:
applying an excitation voltage to each of said first and second capacitive sensors, said excitation voltage being characterized by a first excitation voltage component, a second excitation voltage component, and a third excitation voltage component, said second and third excitation voltage components having opposite polarities;
extracting a sense signal from said first and second capacitive sensors in response to said first excitation voltage component;
extracting a diagnostic signal from said first and second capacitive sensors in response to said second and third excitation components; and
detecting a fault condition in said sensor system when a difference between said sense signal and said diagnostic signal is outside a predetermined limit.

12. The method of claim 11 wherein said applying comprises multiplexing said first, second, and third excitation voltage components by separating said first, second, and third excitation voltage components in time to form said excitation voltage.

13. The method of claim 12 wherein said multiplexing comprises forming a waveform of said excitation voltage that sequentially includes a first occurrence of said first excitation voltage component, said second excitation voltage component, a second occurrence of said first excitation voltage component, and said third excitation voltage component.

14. The method of claim 11 wherein:
said first excitation voltage component is applied for a first duration of time;
said second excitation voltage component is applied for a second duration of time; and
said third excitation voltage component is applied for said second duration of time, said second duration being less than said first duration.

15. The method of claim 11 wherein said applying comprises:
applying said first excitation voltage component to said first and second capacitive sensors in a differential-mode of operation; and
applying said second and third voltage components to said first and second capacitive sensors in a common-mode of operation.

16. The method of claim 15 further comprising:
generating a differential-mode output signal from said first and second capacitive sensors in response to application of said first excitation voltage component, said sense signal being extracted from said differential-mode output signal; and
generating a common-mode output signal from said first and second capacitive sensors in response to application of said second and third excitation voltage components, said diagnostic signal being extracted from said common-mode output signal.

17. The method of claim 11 further comprising:
producing a data stream in response to applying said excitation voltage, said data stream including a differential-mode output signal and a common-mode output signal;
said extracting said sense signal comprises utilizing first filter circuitry to extract said sense signal from said data stream; and
said extracting said diagnostic signal comprises demodulating said data stream to produce a demodulated data stream and utilizing second filter circuitry to extract said diagnostic signal from said demodulated data stream.

18. A sensor system comprising:
a first capacitive sensor;
a second capacitive sensor;
an excitation circuit electrically coupled with said first and second capacitive sensors, said excitation circuit being configured to apply an excitation voltage to each of said first and second capacitive sensors, said excitation voltage being characterized by a first excitation voltage component, a second excitation voltage component, and a third excitation voltage component, said second and third excitation voltage components having opposite polarities, wherein said excitation circuit is configured to multiplex said first, second, and third excitation voltage components by separating said first, second, and third excitation voltage components in time to form said excitation voltage, and said excitation circuit is configured to apply said first excitation voltage component to said first and second capacitive sensors in a differential-mode of operation and apply said second and third voltage components to said first and second capacitive sensors in a common-mode of operation;
a capacitance-to-voltage (C/V) converter electrically coupled with said first and second capacitive sensors, said C/V converter being configured to generate a differential-mode output signal in response to said first excitation voltage component applied to said first and second capacitive sensors, and said C/V converter being further configured to generate a common-mode output signal in response to said second and third excitation voltage components applied to said first and second capacitive sensors; and
a signal processing unit electrically coupled with said C/V converter, said signal processing unit being configured to extract a sense signal from said differential-mode output signal, extract a diagnostic signal from said common-mode output signal, and detect a fault condition in said sensor system when a difference between said sense signal and said diagnostic signal is outside a predetermined limit.

19. The sensor system of claim 18 wherein said excitation circuit is further configured to produce a waveform of said excitation voltage that sequentially includes a first occurrence of said first excitation voltage component, said second excitation voltage component, a second occurrence of said first excitation voltage component, and said third excitation voltage component, and said excitation circuit is further configured to apply said first and second occurrences of said first excitation voltage component for a first duration of time, apply said second excitation voltage component for a second duration of time, and apply said third excitation voltage component for said second duration of time, said second duration being less than said first duration.

20. The sensor system of claim 19 wherein said differential-mode output signal and said common-mode output signal are output from said C/V converter as a data stream, and said signal processing unit comprises:
a first filter circuit configured to receive said data stream and extract said sense signal from said data stream;

a demodulator configured to receive said data stream and demodulate said data stream to produce a demodulated data stream; and a second filter circuit electrically coupled to said demodulator and configured extract said diagnostic signal from said demodulated data stream.

\* \* \* \* \*